United States Patent
Feng

(10) Patent No.: US 11,576,285 B2
(45) Date of Patent: Feb. 7, 2023

(54) HEAT DISSIPATION DEVICE, HEAT DISSIPATION METHOD AND TERMINAL

(71) Applicant: Xiamen Tianma Micro-Electronics Co., Ltd., Xiamen (CN)

(72) Inventor: Hebing Feng, Shanghai (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 56 days.

(21) Appl. No.: 17/349,477

(22) Filed: Jun. 16, 2021

(65) Prior Publication Data

US 2021/0315134 A1 Oct. 7, 2021

(30) Foreign Application Priority Data

Jan. 29, 2021 (CN) .......................... 202110127082.6

(51) Int. Cl.
*H05K 7/20* (2006.01)

(52) U.S. Cl.
CPC ..... *H05K 7/20972* (2013.01); *H05K 7/20209* (2013.01); *H05K 7/20145* (2013.01)

(58) Field of Classification Search
CPC ........... H05K 7/20145; H05K 7/20209; H05K 7/20972
See application file for complete search history.

(56) References Cited

U.S. PATENT DOCUMENTS

| | | | | |
|---|---|---|---|---|
| 6,407,917 B1* | 6/2002 | Craft, Jr. | ............... | H01L 23/467 257/722 |
| 6,504,718 B2* | 1/2003 | Wu | .................... | H05K 7/20727 174/15.1 |
| 9,098,256 B2* | 8/2015 | Yen | ........................... | G06F 1/20 |
| 9,338,923 B2* | 5/2016 | Lee | ......................... | G06F 1/203 |
| 9,961,796 B1* | 5/2018 | Peng | ................. | H05K 7/20727 |
| 10,888,028 B2* | 1/2021 | Yang | ................. | H05K 7/20618 |
| 2015/0055296 A1* | 2/2015 | Joko | ................. | H05K 7/20145 165/96 |

FOREIGN PATENT DOCUMENTS

CN 101872580 A 10/2010

* cited by examiner

*Primary Examiner* — Zachary Pape
(74) *Attorney, Agent, or Firm* — Christensen O'Connor Johnson Kindness PLLC

(57) ABSTRACT

A heat dissipation device, a heat dissipating method, and a terminal are described. In an embodiment, the heat dissipation device, a heat dissipating method, and a terminal are configured to correspondingly form at least one ventilation wall that is configured to dissipate heat on different heat source positions of the terminal, and form a flow path of the heat dissipation airflow generated by the at least one ventilation wall, based on different heat source positions of the terminal in different applications. In an embodiment, the entire heat dissipation of the terminal can be achieved by the flexible and variable flow path to provide a good user experience.

17 Claims, 29 Drawing Sheets

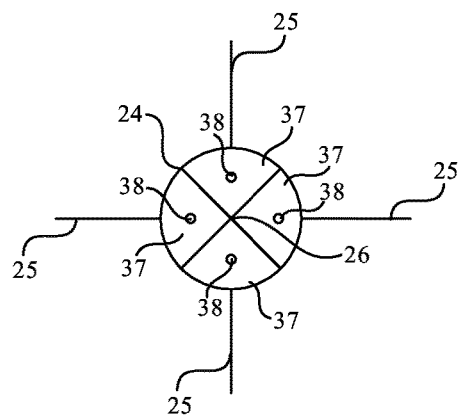

FIG. 29

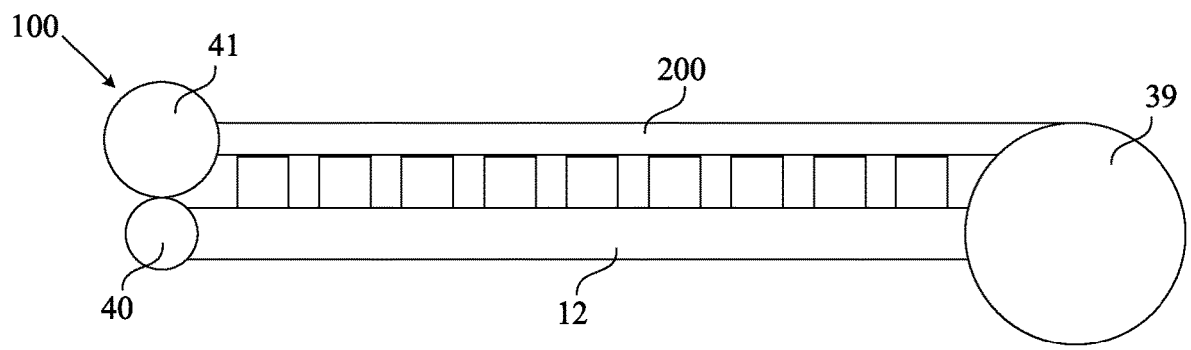

FIG. 30

| Sensing temperatures at different positions of the terminal to determine at least one heat source position. |
|---|

| Forming at least one ventilation wall group based on the temperature at at least one of the positions, the at least one ventilation wall group having a flow path for allowing heat dissipation airflow to flow therethrough, and the at least one heat source position being located in the flow path. |
|---|

FIG. 31

HEAT DISSIPATION DEVICE, HEAT DISSIPATION METHOD AND TERMINAL

CROSS-REFERENCE TO RELATED APPLICATION

The present application claims priority to Chinese Patent Application No. 202110127082.6, filed on Jan. 29, 2021, the content of which is incorporated herein by reference in its entirety.

TECHNICAL FIELD

The present disclosure relates to the field of display, and in particular, to a heat dissipation device, a heat dissipation method and a terminal.

BACKGROUND

With the development of science and technology, installation of a display device on various types of terminals has become more prevalent, and various types of smart visualization devices are gradually changing the human living environment and bringing major changes to the science and technology.

Presently, display devices are widely applied to various types of smart visualization devices. The display device can have rigid, fixed flexible, variable flexible and other forms, and also be applied to the various types of smart visualization devices, such as foldable mobile phones, tablet computers, and rollable screens. When a user uses different terminals, the display devices of different forms may enhance sensory experience and comfort usage of the user.

However, as display devices with different forms, diversified functions, and large-screen displays have been developed, heat dissipation of the display devices becomes important. Existing display devices are powerful in applications and functions, and generally require operation for a long period. During the extended operation of the display device, the display screen of the display device has a local temperature that is too high, which affects the use of the display device as well as the sensory experience and the visual comfort of the user. Moreover, as the volume and thickness of the display device become smaller, the heat dissipation of the display device also confronts challenges, and the local heat is significantly increased. Heat dissipation schemes employed in the existing display device generally includes applying adhesive graphite sheets, adding fans, adding heat pipes, etc., which obviously cannot adapt to the development of lightness and thickness of the display device, nor flexibly adapt to the various types of terminals, so that the practical application of the existing display device is limited.

SUMMARY

In order to solve the above problems, the present disclosure provides a heat dissipation device, a heat dissipating method and a terminal.

In a first aspect of the present disclosure, a heat dissipation device for a terminal is provided. In an embodiment, the heat dissipation device includes a variable ventilation wall assembly that is configured to form a plurality of ventilation wall groups based on at least one heat source position of the terminal. In an embodiment, each ventilation wall group of the plurality of ventilation wall groups defines a flow path, along which heat dissipation airflow flows. In an embodiment, each of the at least one heat source position is located in one of the flow paths of the plurality of ventilation wall groups.

In some embodiments of the present disclosure, the variable ventilation wall assembly includes a plurality of blocking member groups located at different positions of a plane of the terminal. In an embodiment, a gap is formed between two adjacent blocking member groups of the plurality of blocking member groups. In an embodiment, each ventilation wall group of the plurality of ventilation wall groups includes a first ventilation wall and a second ventilation walls. In an embodiment, the first ventilation wall and the second ventilation wall are configured to define the flow path, and at least one of the first ventilation walls or the second ventilation walls of different ventilation wall groups of the plurality of ventilation wall groups are different in at least one of position or shape. In an embodiment, operation states of the heat dissipation device includes a first operation state in which the plurality of blocking member groups includes a plurality of first partial blocking member groups, a plurality of second partial blocking member groups, and a plurality of third partial blocking member groups. In an embodiment, the plurality of first partial blocking member groups is continuously arranged in a first direction, and two adjacent first partial blocking member groups of the plurality of first partial blocking member groups are in contact with each other to block the gap therebetween to form the first ventilation wall extending in the first direction. In an embodiment, the plurality of second partial blocking member groups is continuously arranged in a second direction, and two adjacent second partial blocking member groups of the plurality of second partial blocking member groups are in contact with each other to block the gap therebetween to form the second ventilation wall extending in the second direction. In an embodiment, the plurality of third partial blocking member groups is arranged in the flow path or outside at least one of the first ventilation wall or the second ventilation wall, two adjacent third partial blocking member groups of the plurality of third partial blocking member groups are spaced at the gap therebetween, one of the plurality of third partial blocking member groups and one of the plurality of first partial blocking member groups that are adjacent to each other are spaced at the gap therebetween, and one of the plurality of third partial blocking members and one of the plurality of second partial blocking member groups that are adjacent to each other are spaced at the gap therebetween. In an embodiment, a space is formed between the first ventilation wall and the second ventilation wall.

In some embodiments of the present disclosure, each blocking member group of the plurality of blocking member groups includes a blocking post and a plurality of blocking members. In an embodiment, the plurality of blocking members is installed on the blocking post, and the plurality of blocking members extends in different directions that are parallel to the plane of the terminal. In an embodiment, in the first operation state, among the plurality of first partial blocking member groups, one of a plurality of blocking members extending in the first direction, of one first partial blocking member group, is in contact with one of a plurality of blocking members extending in the first direction, of another first partial blocking member group adjacent to the one first partial blocking member group; and among the plurality of second partial blocking member groups, one of a plurality of blocking members extending in the second direction, of one second partial blocking member group, is in contact with one of a plurality of blocking members extending in the second direction, of another second partial blocking member group adjacent to the one second partial blocking member group.

In some embodiments of the present disclosure, the variable ventilation wall assembly further includes a temperature sensor, a processor and a driver. In an embodiment, the temperature sensor is configured to sense temperatures at different positions of the terminal and transmit the sensed temperatures to the processor. In an embodiment, the processor is configured to obtain, based on a preset temperature condition, the at least one heat source position of the terminal that meets the preset temperature condition, to obtain ventilation wall information corresponding to the at least one heat source position and a temperature at the at least one heat source position based on a preset ventilation wall condition, and to transmit the ventilation wall information to the driver. In an embodiment, the driver is configured to drive, based on the ventilation wall information, the plurality of blocking members of the plurality of blocking member groups to move. In an embodiment, the ventilation wall information includes position information and shape information of the plurality of ventilation wall groups.

In some embodiments of the present disclosure, in each blocking member group of the plurality of blocking member groups, the blocking post includes a plurality of blocking sub-posts circumferentially arranged around a central axis of the blocking post. In an embodiment, each blocking sub-post of the plurality of blocking sub-posts is correspondingly installed with one of the plurality of blocking members. In an embodiment, the driver includes a plurality of sub-drives, and each of the plurality of sub-drivers is correspondingly installed on one of the plurality of blocking sub-posts and correspondingly drives one of the plurality of blocking members to move.

In some embodiments of the present disclosure, each blocking member of the plurality of blocking members includes a plurality of blocking sub-members sequentially nested in an extending direction of the blocking member. In an embodiment, two adjacent blocking sub-members of the plurality of blocking sub-members are movable relative to each other under driving of the driver.

In some embodiments of the present disclosure, each blocking member group of the plurality of blocking member groups further includes a plurality of elastic members connected to the plurality of blocking members. In an embodiment, each elastic member of the plurality of elastic members is deformable along an extending direction of one of the plurality of blocking members under driving of the driver.

In some embodiments of the present disclosure, the variable ventilation wall assembly further includes a plurality of first receiving members, and each first receiving member of the plurality of first receiving members includes a cavity and a housing that at least partially encloses the cavity. In an embodiment, the housing includes a plurality of guiding holes in communication with the cavity, and the blocking member group is located in the cavity. In an embodiment, the terminal is supported by the housing, and the temperature sensor is located at a side of the housing close to the terminal. In an embodiment, an end of each of the plurality of blocking members is movable to outside of the housing or inside of the cavity through one of the plurality of guiding holes.

In some embodiments of the present disclosure, blocking members of the plurality of blocking members are equally spaced in a circumferential direction one of the plurality of first receiving member.

In some embodiments of the present disclosure, the end of each of the plurality of blocking members includes a soft magnetic material. In an embodiment, the driver is further configured to provide different electrical signals to the plurality of blocking members in such a manner that the plurality of blocking members has different magnetization directions.

In some embodiments of the present disclosure, the variable ventilation wall assembly further includes a pressure sensor configured to sense pressures applied on ends of the plurality of blocking members and transmit the sensed pressures to the driver. In an embodiment, the driver is further configured to control the plurality of blocking members to stop based on a preset pressure condition.

In some embodiments of the present disclosure, blocking member groups of the plurality of blocking member groups are arranged in an array.

In some embodiments of the present disclosure, the heat dissipation device further includes a support plate configured to support the plurality of blocking member groups. In an embodiment, the support plate is located at a side of the plurality of blocking member groups facing away from the terminal.

In some embodiments of the present disclosure, the support plate includes a shape memory material, and the operation states of the heat dissipation device further include a second operation state. In an embodiment, the heat dissipation device further includes a second receiving member, and a controller electrically connected to the support plate. In an embodiment, the controller is configured to control the support plate to be unrolled and flattened in the first operation state, and control the support plate to be rolled so as to be received in the second receiving member in the second operation state.

In a second aspect of the present disclosure, a heat dissipation method of a terminal is provided, and the heat dissipation method uses the heat dissipation device as described in the first aspect of the present disclosure. In an embodiment, the heat dissipation method includes sensing temperatures at different positions of the terminal to determine the at least one heat source position, and forming at least one ventilation wall group of the plurality of ventilation wall groups based on the sensed temperature at the at least one heat source position. Each of the at least one ventilation wall group has the flow path for allowing the heat dissipation airflow to flow therethrough, and the at least one heat source position is located in the flow path.

In some embodiments of the present disclosure, the variable ventilation wall assembly includes a plurality of blocking member groups corresponding to the different positions of the terminal. In an embodiment, two adjacent blocking member groups of the plurality of blocking member groups are positioned to define a gap therebetween. In an embodiment, each ventilation wall group of the plurality of ventilation wall groups includes a first ventilation wall and a second ventilation walls. In an embodiment, the first ventilation wall and the second ventilation wall are configured to define the flow path of the heat dissipation airflow, and at least one of the first ventilation walls or the second ventilation walls of different ventilation wall groups of the plurality of ventilation wall groups are different in at least one of position or shape. In an embodiment, the plurality of blocking member groups includes a plurality of first partial blocking member groups, a plurality of second partial blocking member groups, and a plurality of third partial blocking member groups. In an embodiment, the plurality of first partial blocking member groups is continuously arranged in a first direction, the plurality of second partial blocking member groups is continuously arranged in a second direction, and the plurality of third partial blocking member groups is arranged in the flow path or outside at least one of the first ventilation wall or the second ventilation wall. In an embodiment, the heat dissipation method further includes, between sensing temperature at different positions of the terminal and forming at least one ventilation wall group based on the temperature at least one of the positions: obtaining the at least one the heat source position of the terminal that meets a preset temperature condition; obtaining ventilation wall information corresponding to the at least one heat source position and a temperature at the at least one heat source position based on a preset ventilation wall condition; and based on the ventilation wall information, controlling two adjacent first partial barrier groups of the plurality of first partial blocking member groups to be in contact with each other to block the gap therebetween to form the first ventilation wall, and controlling two adjacent second partial barrier groups of the plurality of second partial blocking member groups to be in contact with each other to block the gap therebetween to form the second ventilation wall, wherein a space is formed between the first ventilation wall and the second ventilation wall. In an embodiment, the ventilation wall information comprises position information and shape information of the at least one ventilation wall group to be formed.

In a third aspect of the present disclosure, a terminal is provided. In an embodiment, the terminal includes a casing, a display panel, and the heat dissipation device as described in the first aspect of the present disclosure. In an embodiment, the heat dissipation device is installed in the casing, and the display panel is installed on the heat dissipation device.

In some embodiments of the present disclosure, the casing includes a bottom plate, and a plurality of frames arranged on edges of the bottom plate. In an embodiment, the heat dissipation device is disposed on the bottom plate, and the plurality of frames is arranged around the heat dissipation device. In an embodiment, the casing is provided with at least one air outlet, and the variable ventilation wall assembly is disposed in the casing. In an embodiment, the at least one air outlet is disposed in at least one of the plurality of frames, and the at least one air outlet is in thermal communication with the flow path.

The heat dissipation device, the heat dissipating method and the terminal according to the present disclosure can correspondingly form the ventilation wall adapted to dissipate heat at different heat source positions and the flow path of the heat dissipation airflow generated by the ventilation wall based on different heat source positions of the terminal in different applications. Further, in an embodiment, the entire heat dissipation of the terminal can be achieved by the flexible and variable flow path, so that a good user experience is obtained.

BRIEF DESCRIPTION OF DRAWINGS

In order to clearly describe technical solutions of the embodiments of the present disclosure, accompanying drawings will be briefly described hereinafter. It is apparent that the accompanying drawings in the following description are some embodiments of the present disclosure. Other drawings may be obtained by those skilled in the art without any inventive step.

FIG. 29 is a schematic structural view of a heat dissipation device according to a second embodiment of the present disclosure, in which each blocking member of a blocking member group is individually controlled;

FIG. 30 is a schematic structural view of a heat dissipation device including a support plate with a rollable structure according to a third embodiment of the present disclosure;

FIG. 31 is a schematic flowchart of a heat dissipation method according to a fourth embodiment of the present disclosure;

REFERENCE LIST

Figure 1:
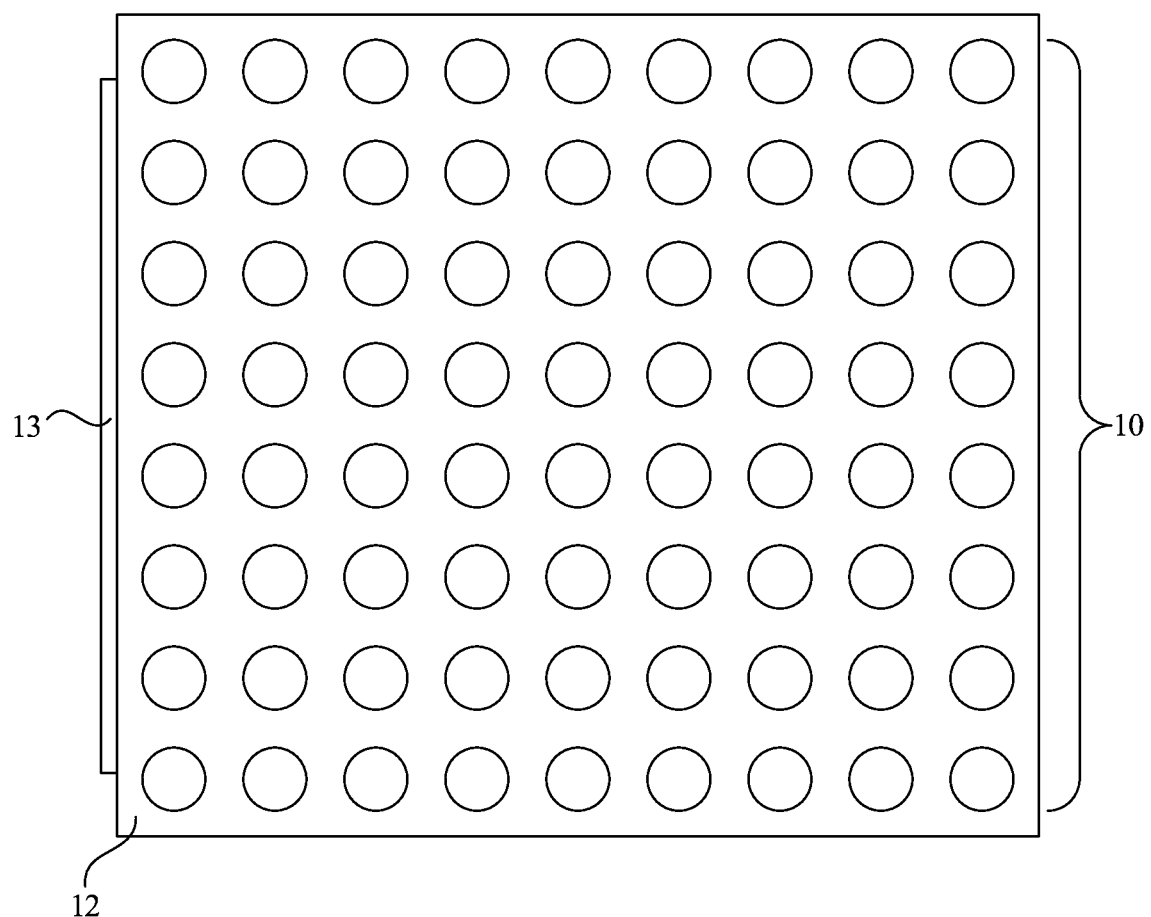
FIG. 1 is a schematic plan view of a heat dissipation device according to a first embodiment of the present disclosure in a case that a ventilation wall group has not been formed.

100: heat dissipation device 100;
200: display panel;
300: terminal;
10: variable ventilation wall assembly;
11: ventilation wall group;
12: support plate;
13: fan;
14: gap;
15: air inlet;
16: blocking member group;
17: first ventilation wall;
18: second ventilation Wall;
19: third ventilation wall;
20: first blocking member subgroup;
21: second blocking member subgroup;
22: third partial blocking member subgroup;
23: space;
24: blocking post;
25: blocking member;
26: central axis;
27: blocking sub-member;
28: elastic member;
29: first receiving member;
30: cavity;
31: housing;
32: guiding hole;
33: temperature sensor;
34: processor;
35: driver;
36: pressure sensor;
37: blocking sub-post;
38: sub-driver;
39: second receiving member;
40: gear;
41: rotatable shaft;
42: casing;
43: bottom plate;
44: frame;
45: air outlet;
46: connection rod;

D1: first direction;
D2: second direction;
S: flow path;
S1: main flow path;
S2: branch flow path;
S3: narrowed portion.

DESCRIPTION OF EMBODIMENTS

In order to understand the technical solutions of the present disclosure, embodiments of the present disclosure will be described in detail below with reference to the accompanying drawings.

It should be noted that the embodiments described below are merely some of, rather than all of, the embodiments of the present disclosure. In view of the embodiments of the present disclosure, all other embodiments made by those skilled in the art without any inventive step shall fall within the scope of the present disclosure.

The terms used in the description of the present disclosure are merely for the purpose of describing the specific embodiments, but are not intended to limit the present disclosure. The singular form of "a", "said" and "the" used in the embodiments of the present disclosure and the appended claims are also intended to include plural forms, unless otherwise stated.

It should be understood that the term "and/or" used herein is merely an association relationship for describing associated objects, indicating that three relationships may be included. For example, A and/or B means that A exists alone, both A and B exist at the same time, and C exists alone. In addition, the character "I" used herein generally indicates that the associated objects before and after the character "I" have a relationship of "or" therebetween.

It should be understood that although the terms "first", "second", "third", and the like may be used to describe directions, angles, positions, and components in the embodiments of the present disclosure, these directions, angles, positions, and components should not be limited thereto. These terms are merely used to distinguish the directions, angles, positions, components, etc. from each other. For example, the first position may also be referred to as the second position, and the second position may also be similarly referred to as the first position, without departing from the scope of the present disclosure.

First Embodiment

A first embodiment of the present disclosure discloses a heat dissipation device that is applicable to heat dissipation of a terminal. Existing terminals have higher requirements for performance, lightness and thinness, and user experience. Electronic devices of the terminal located at different positions may perform responsive processing for different applications when the terminal operates. Heat will be generated to form a heat source during the processing of the electronic devices. Since the electronic devices generate the heat sources at different positions during the processing, an existing heat dissipation device for dissipating the heat across an entire interior of the terminal cannot intensively supply a heat dissipation airflow to a position of the heat source for the heat dissipation, which results in poor heat dissipation effect and low heat dissipation efficiency. Therefore, the heat dissipation device according to the first embodiment of the present disclosure can flexibly perform heat dissipation at different positions of the heat source in the terminal, and intensively direct the heat dissipation airflow to the positions of the heat source, to achieve a high-efficiency and high-quality heat dissipation.

Figure 2:
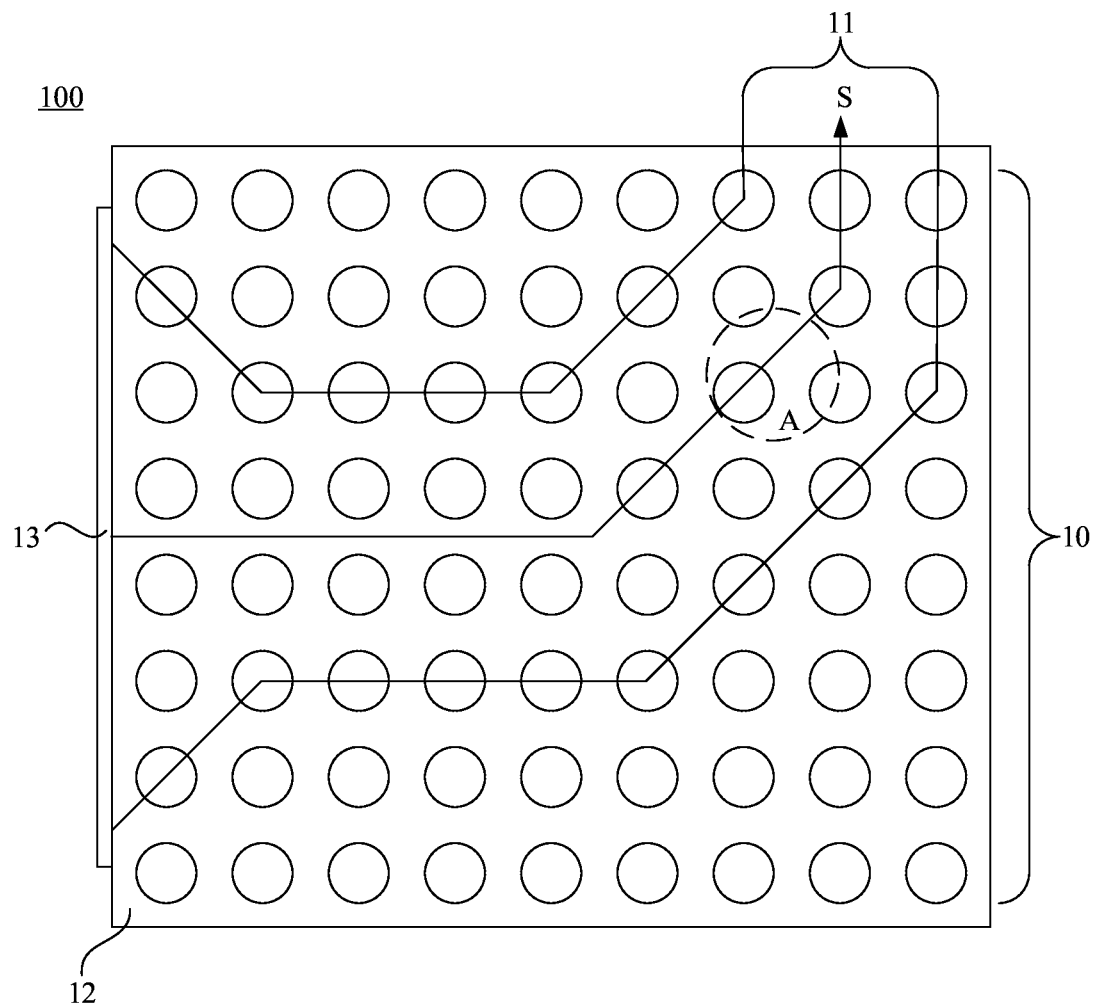
FIG. 2 is a schematic plan view of the heat dissipation device with the ventilation wall group according to the first embodiment of the present disclosure, in which a heat source position of a terminal is located at a position A.
Figure 3:
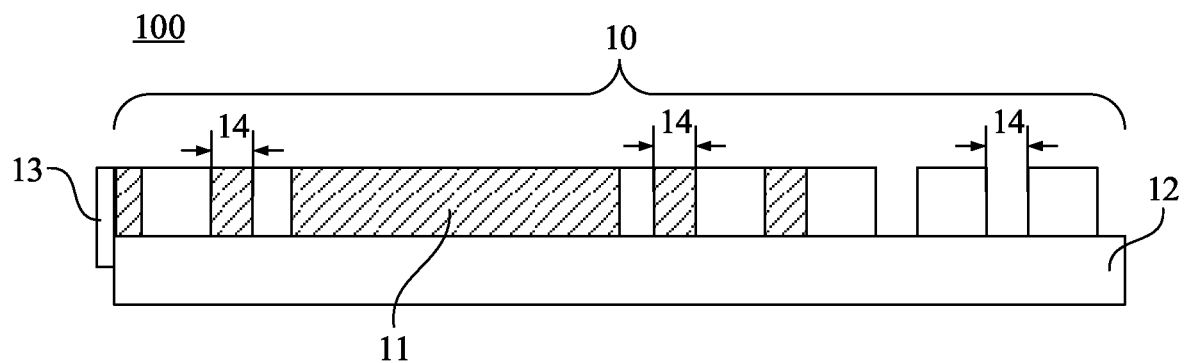
FIG. 3 is a schematic side sectional view of the heat dissipation device with the ventilation wall group according to the first embodiment of the present disclosure.

As shown in FIG. 1, a heat dissipation device 100 according to the first embodiment of the present disclosure includes a variable ventilation wall assembly 10 disposed on a support plate 12. A fan 13 is disposed on at least one side of the support plate 12. As shown in FIGS. 2 and 3, the variable ventilation wall assembly 10 is configured to form a plurality of ventilation wall groups 11 based on a heat source position of the terminal. Each of the ventilation wall groups 11 has a flow path S, along which a heat dissipation airflow flows. The heat source is located in the flow path S. Referring to FIG. 1, when viewed from the top, the heat dissipation device has not detected a heat source position, and the variable ventilation wall assembly 10 has not formed the ventilation wall group 11, and thus the flow path S is not formed. Referring to FIG. 2, when viewed from the top, a heat source position A where heat is to be dissipated is detected. In this case, the variable ventilation wall assembly 10 forms the ventilation wall group 11 that forms a flow path S passing through the heat source position A. The flow path S extends from a side of the support plate 12 where the fan 13 is installed to another side of the support plate 12 where the fan 13 is not installed, so that the heat dissipation airflow generated by the fan 13 flows along the flow path S and flow through the heat source position A to perform the heat dissipation. Referring to FIG. 3 as viewed in a side section view of the ventilation wall group 11, when the heat dissipation device detects the heat source position where heat is to be dissipated is the heat source position A, the variable ventilation wall assembly 10 extends vertically from a surface of the support plate 12 to form the ventilation wall group 11. The ventilation wall assembly 11 is capable of blocking a plurality of gaps 14 inside the variable ventilation wall assembly 10.

Figure 4:
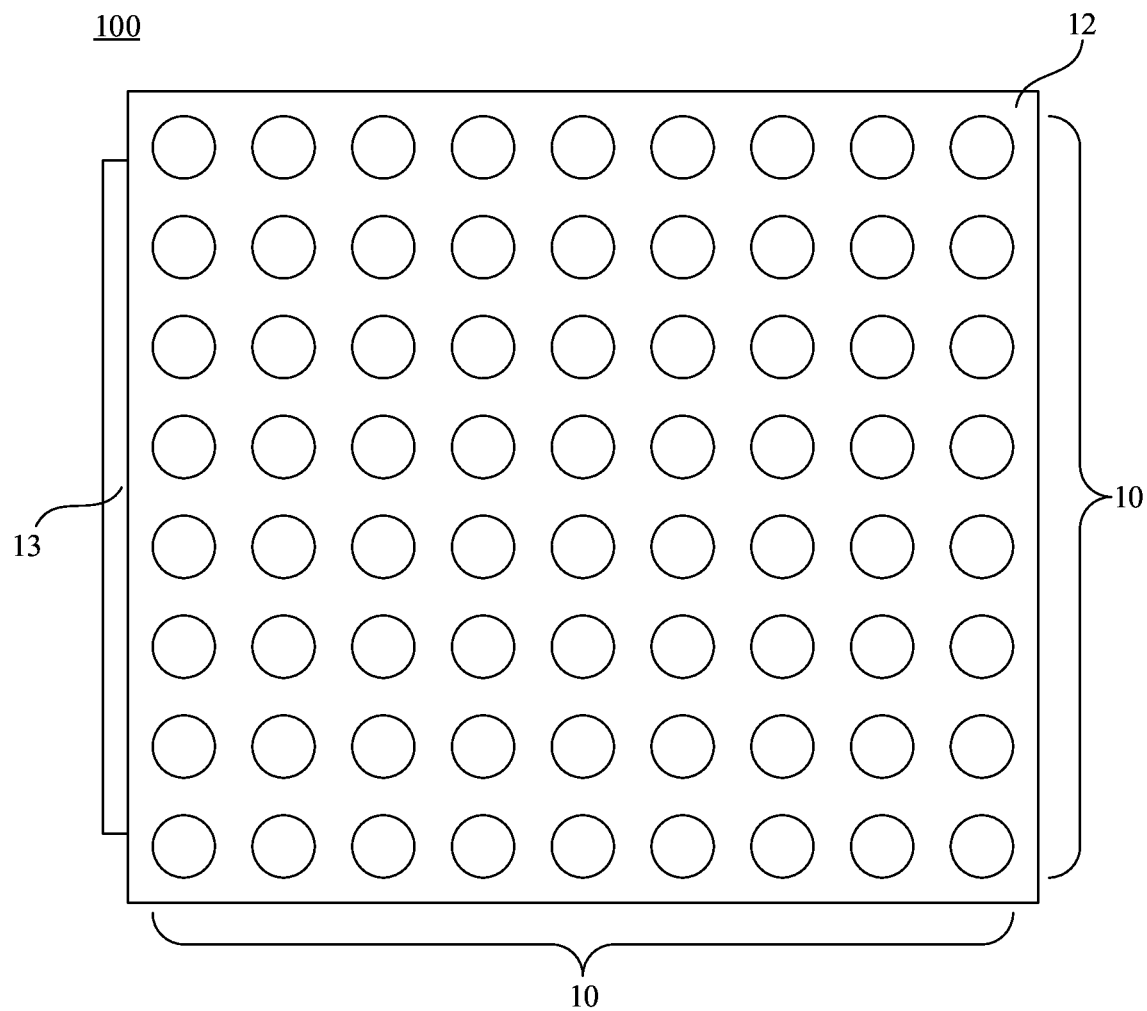
FIG. 4 is a schematic plan view showing a structure of the heat dissipation device with a fan disposed at a left side of a support plate according to the first embodiment of the present disclosure.
Figure 5:
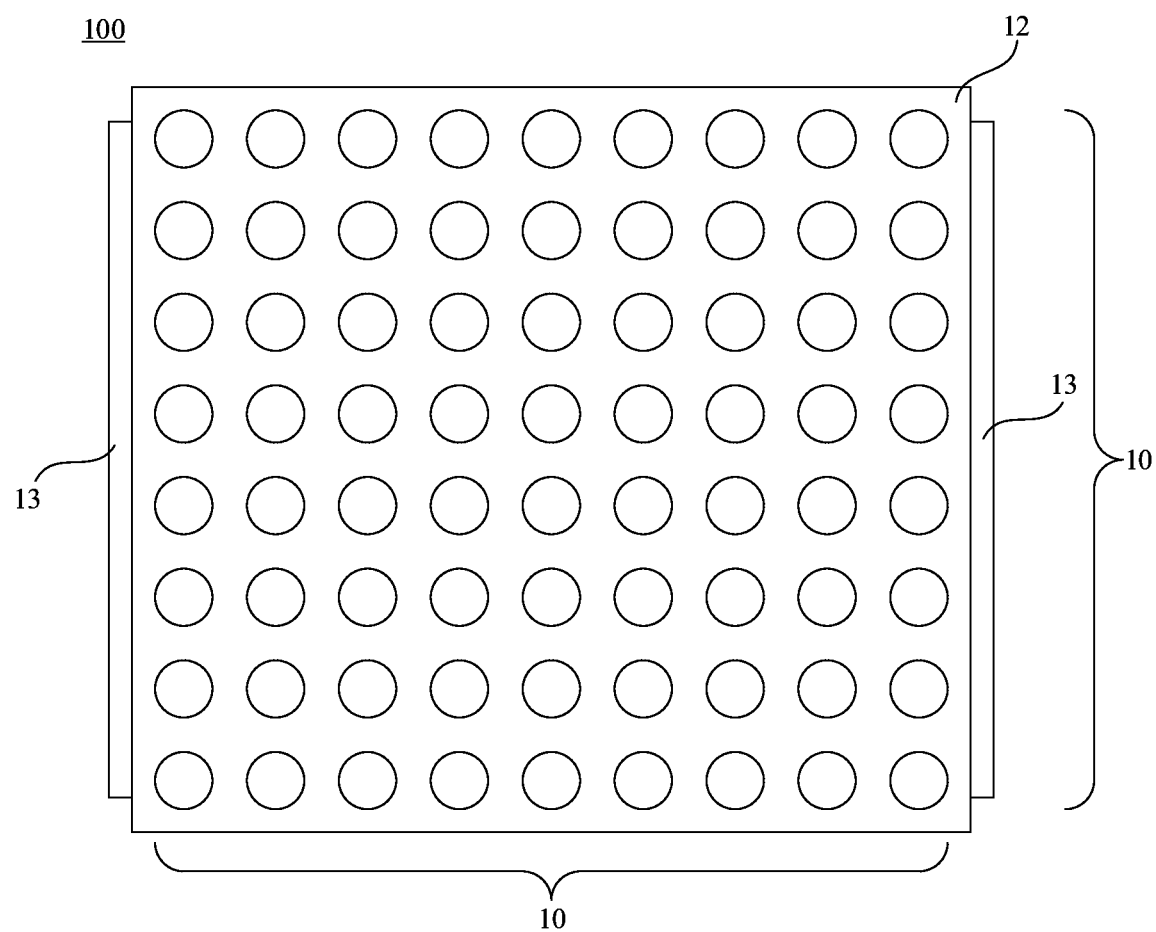
FIG. 5 is a schematic plan view showing a structure of the heat dissipation device with fans disposed at the left side and a right side of the support plate according to the first embodiment of the present disclosure.
Figure 6:
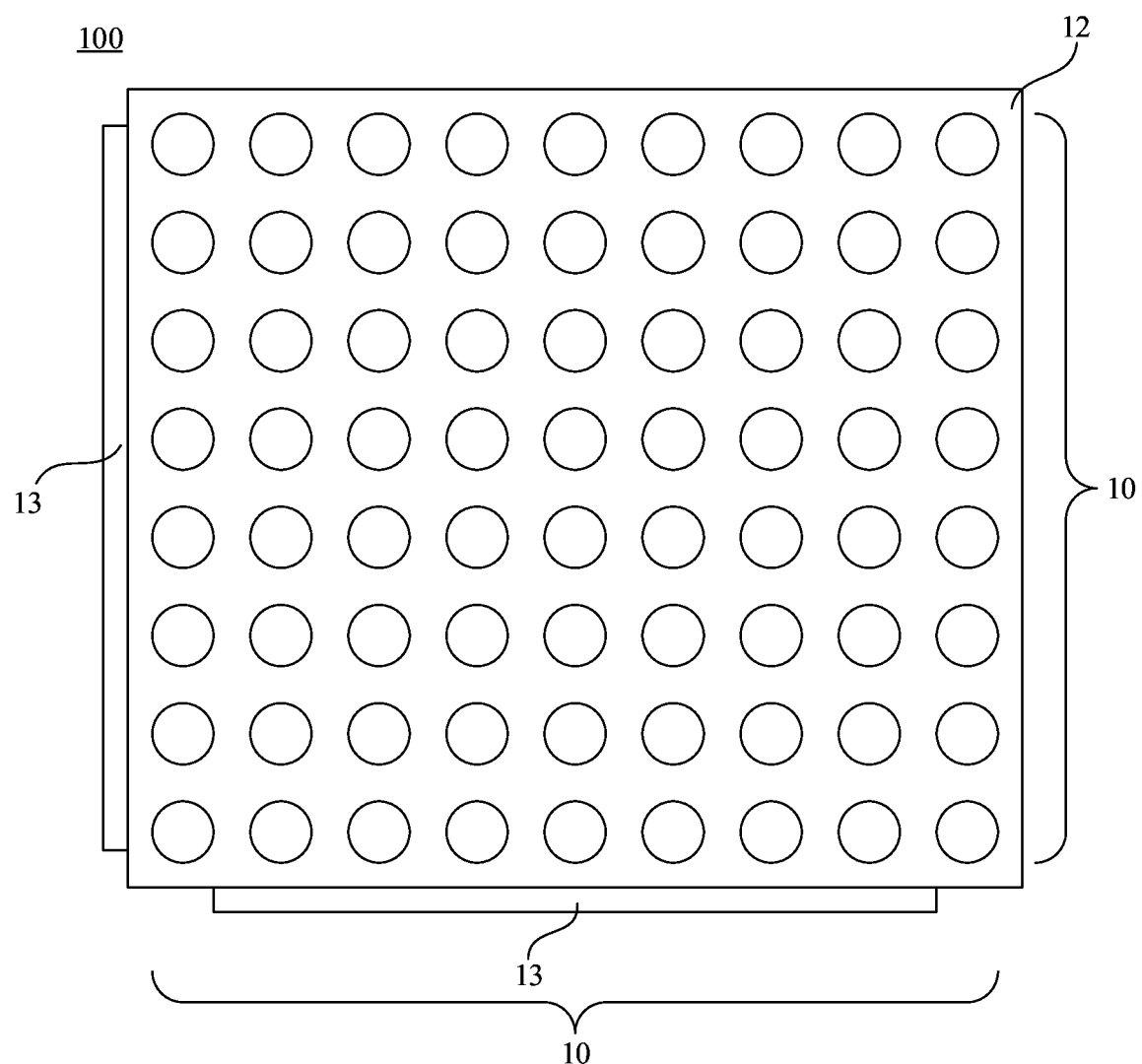
FIG. 6 is a schematic plan view showing a structure of the heat dissipation device with fans disposed at the left side and a lower side of the support plate according to the first embodiment of the present disclosure.
Figure 7:
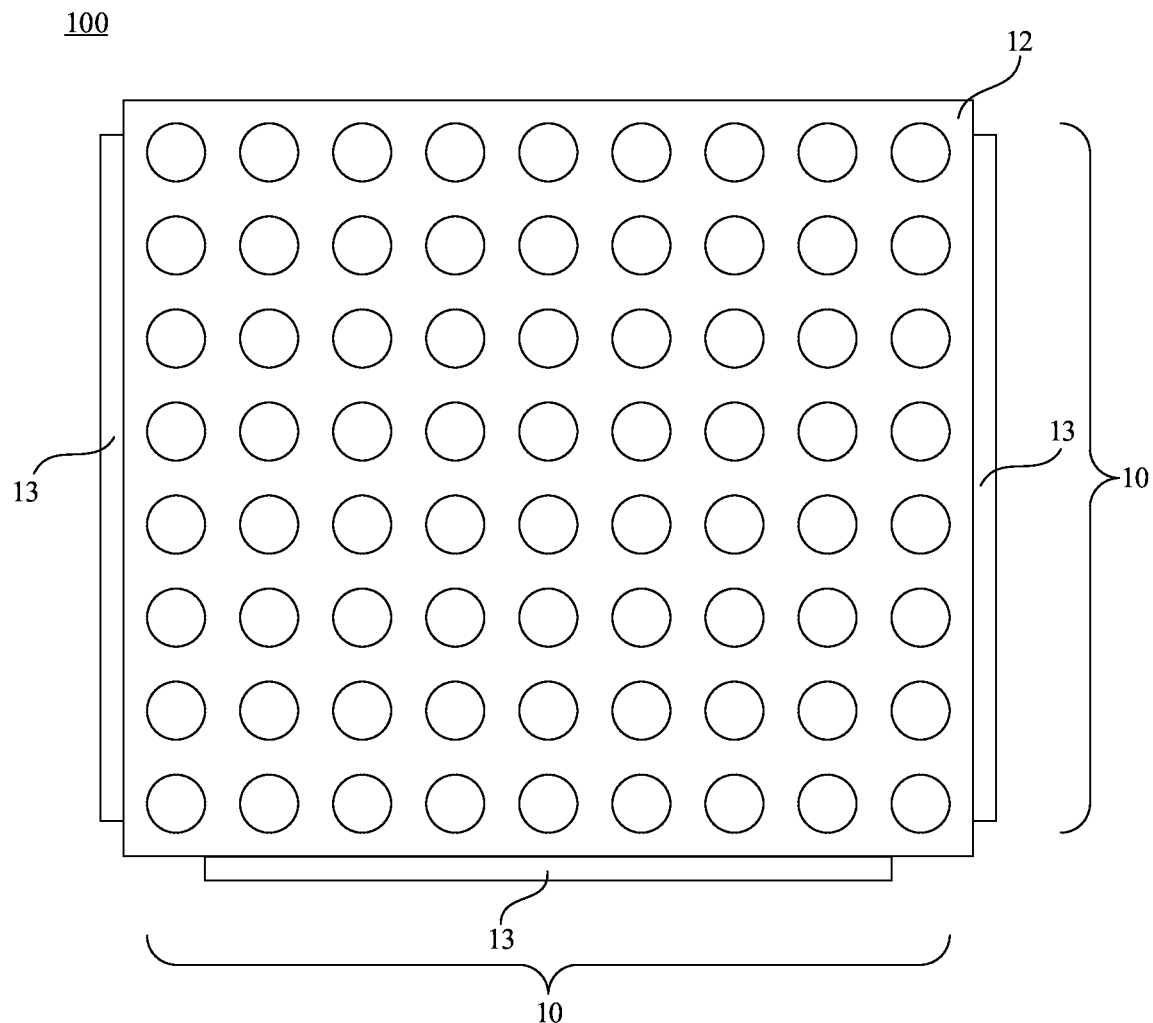
FIG. 7 is a schematic plan view showing a structure of the heat dissipation device with fans disposed at the left side, the right side and the lower side of the support plate according to the first embodiment of the present disclosure.
Figure 8:
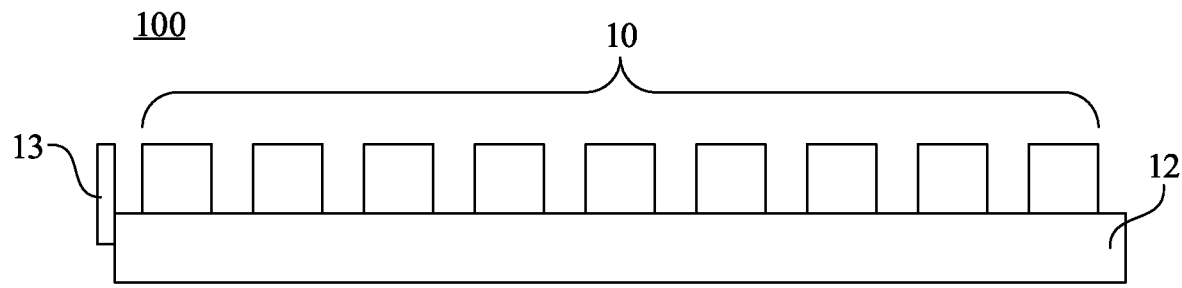
FIG. 8 is a schematic side view showing the structure of the heat dissipation device with the fan disposed at the left side of the support plate according to the first embodiment of the present disclosure.
Figure 9:
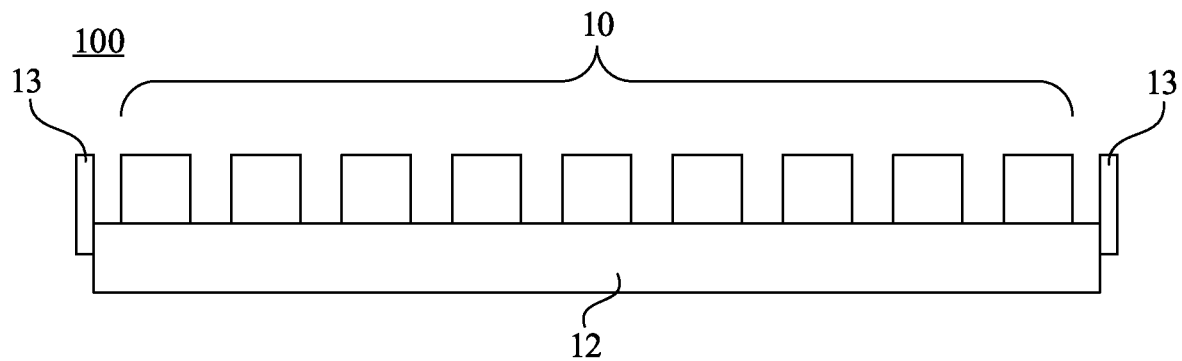
FIG. 9 is a schematic side view showing the structure of the heat dissipation device with the fans disposed at the left side and the right side of the support plate according to the first embodiment of the present disclosure.
Figure 10:
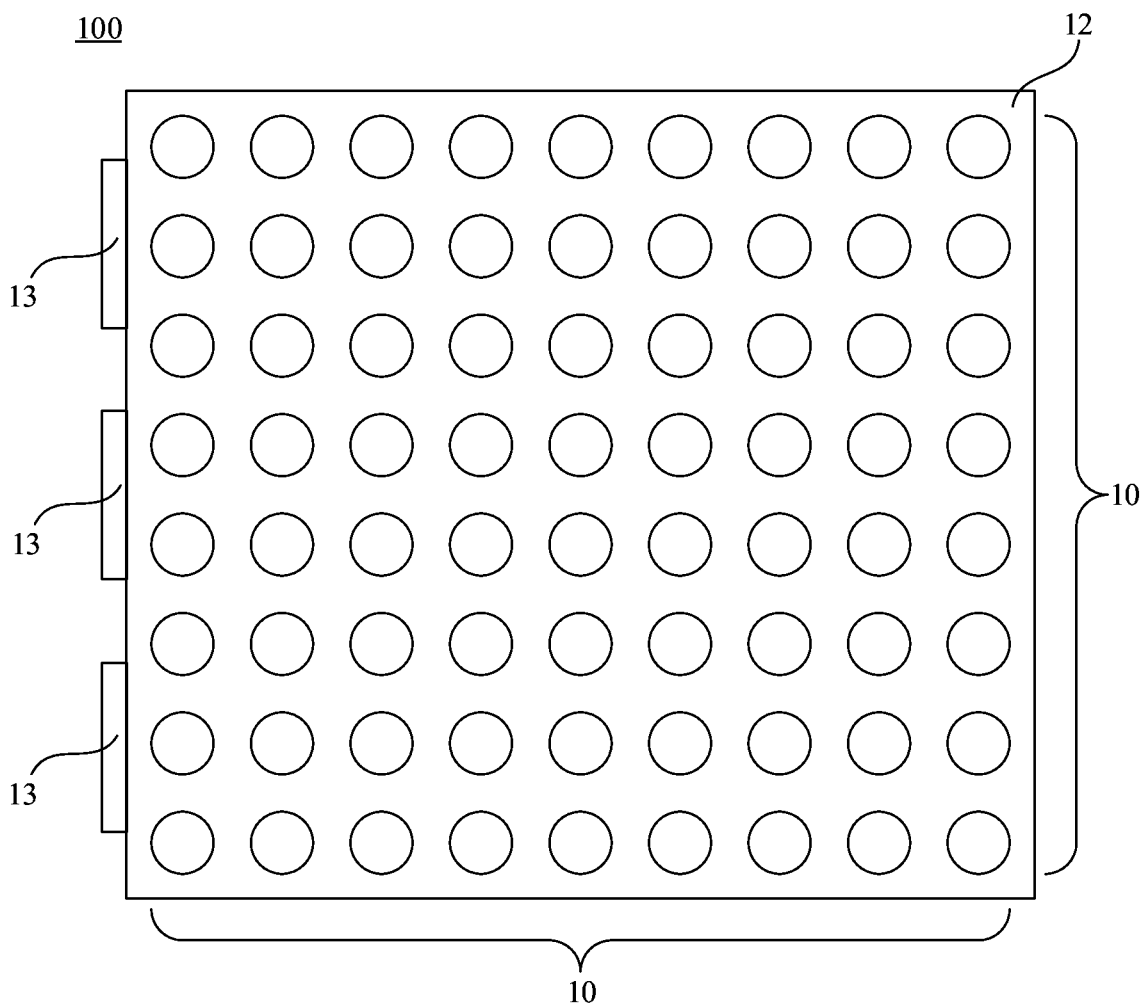
FIG. 10 is a schematic plan view showing a structure of the heat dissipation device with a plurality of fans disposed at a single side of the support plate according to the first embodiment of the present disclosure.

Referring to FIGS. 4 to 10, in the heat dissipation device 100 according to the first embodiment of the present disclosure, the fan 13 is disposed on the at least one side of the support plate 12. The heat dissipation device 100 may be provided with at least one fan 13, and the at least one fan 13 may be disposed at one or more sides of the support plate 12. The fan 13 may be disposed at a left side of the support plate 12, as shown in FIGS. 4 and 8. In some embodiments, the fan 13 may be disposed at each of the left side and a right side of the support plate 12, as shown in FIGS. 5 and 9. In some embodiments, the fan 13 may be disposed at each of the left side and a lower side of the support plate 12, as shown in FIGS. 6 and 8. In some embodiments, the fan 13 may be disposed at each of the left side, the right side and the lower side of the support plate 12, as shown in FIGS. 7 and 9. Referring to FIG. 10, in the cases shown in FIGS. 4 to 7, a plurality of fans 13 may be disposed at the same side of the support plate 12. An example where the fan 13 is disposed at the left side of the support plate 12 as shown in FIG. 4 will be described below.

As shown in FIGS. 11 to 16, the variable wind wall assembly 10 is configured to form a plurality of ventilation wall groups 11 based on the heat source positions of the terminal. Each of the ventilation wall groups 11 has a flow path S, along which the heat dissipation airflow flows. The heat source position is located in the flow path S. Further, the fan 13 is in communication with the flow path S. The variable ventilation wall assembly 10 forms the ventilation wall groups 11 extending in different directions based on different heat source positions, and the ventilation wall groups 11 can direct the heat dissipation airflow generated by the fan 13 to flow to the heat source position, thereby achieving the heat dissipation.

Figure 11:
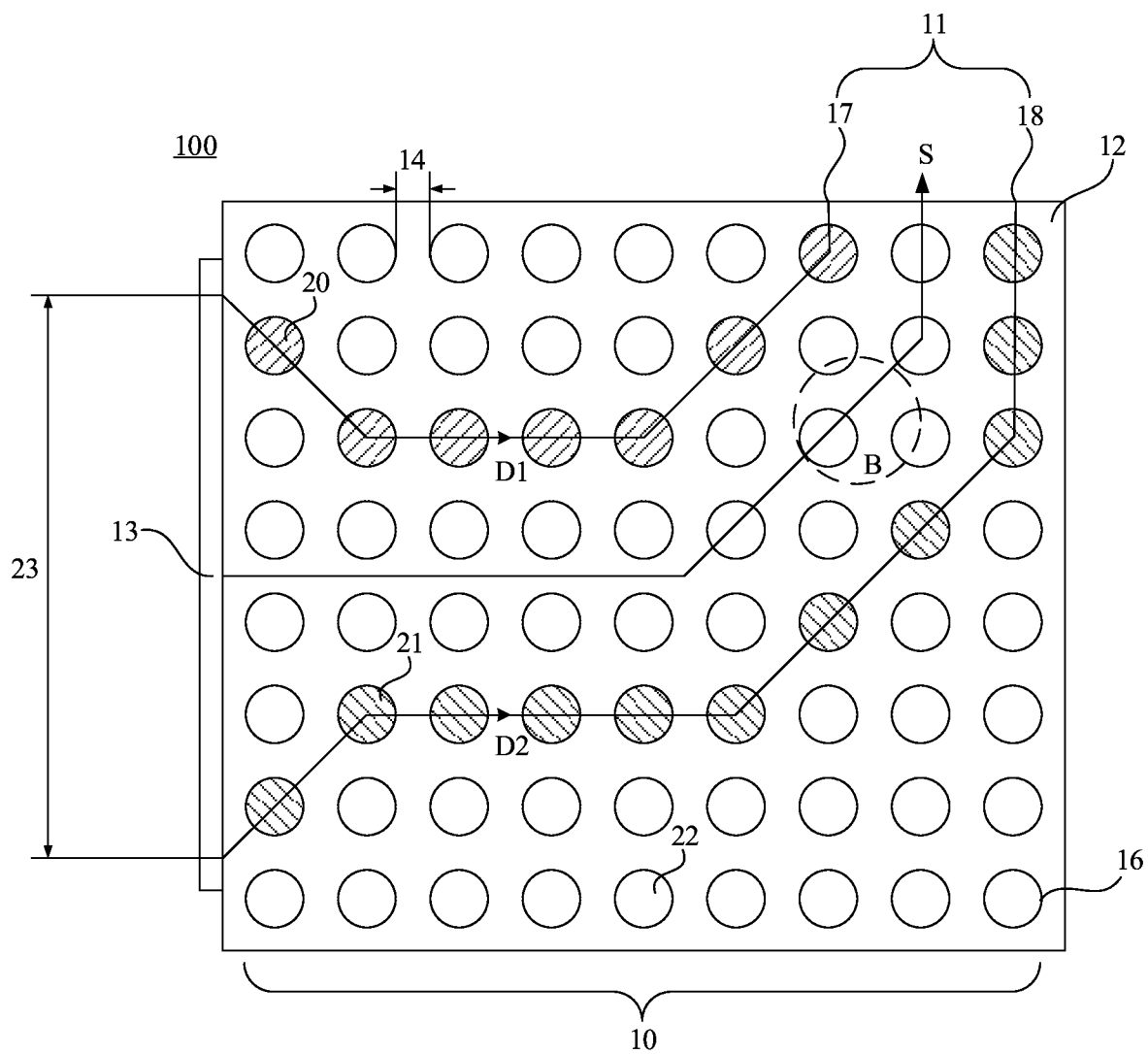
FIG. 11 is a schematic view of a ventilation wall group and a flow path of the heat dissipation device according to the first embodiment of the present disclosure, in which a heat source position of the terminal is located at a position B.
Figure 12:
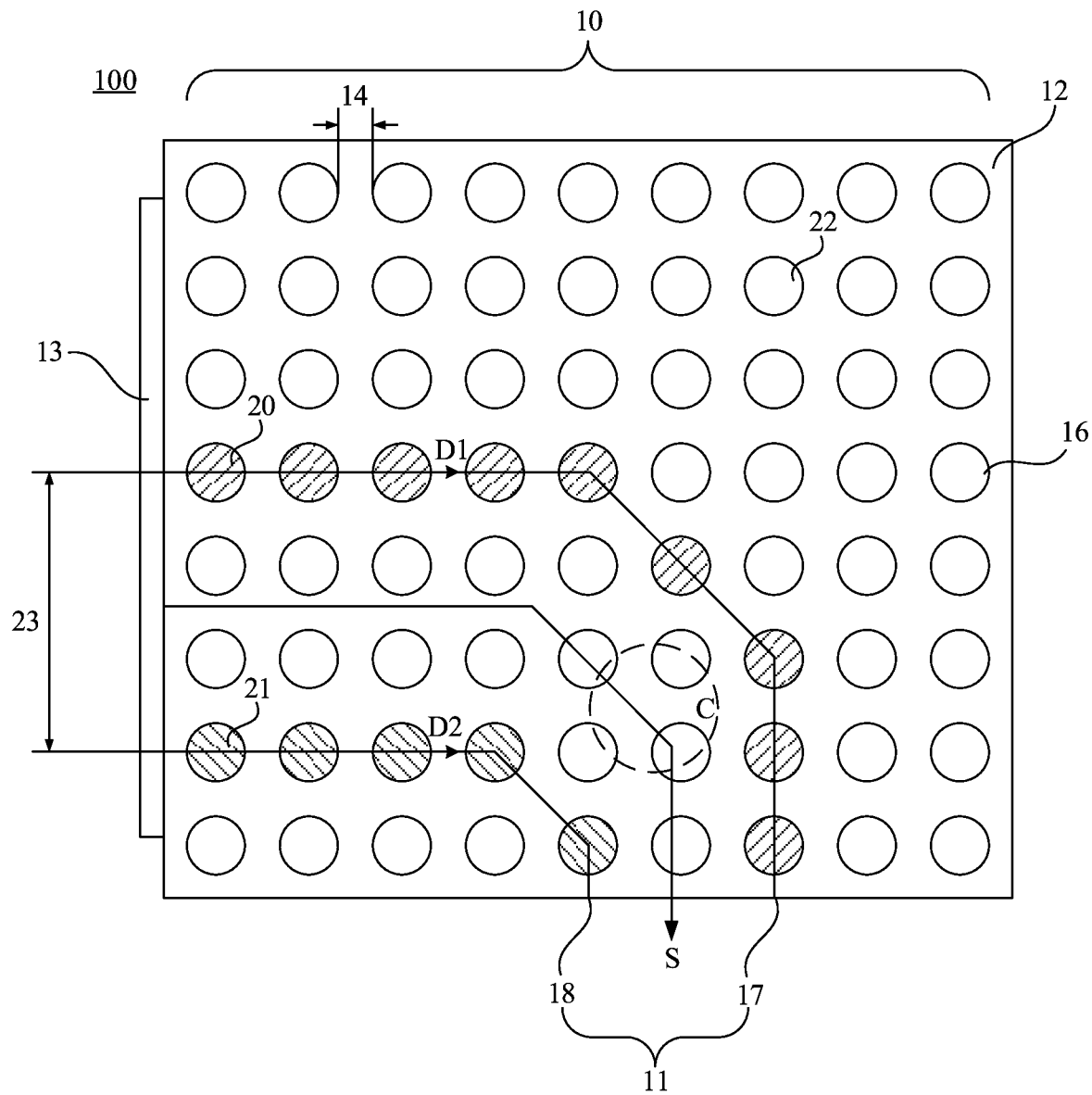
FIG. 12 is a schematic view of a ventilation wall group and a flow path of the heat dissipation device according to the first embodiment of the present disclosure, in which a heat source position of the terminal is located at a position C.
Figure 13:
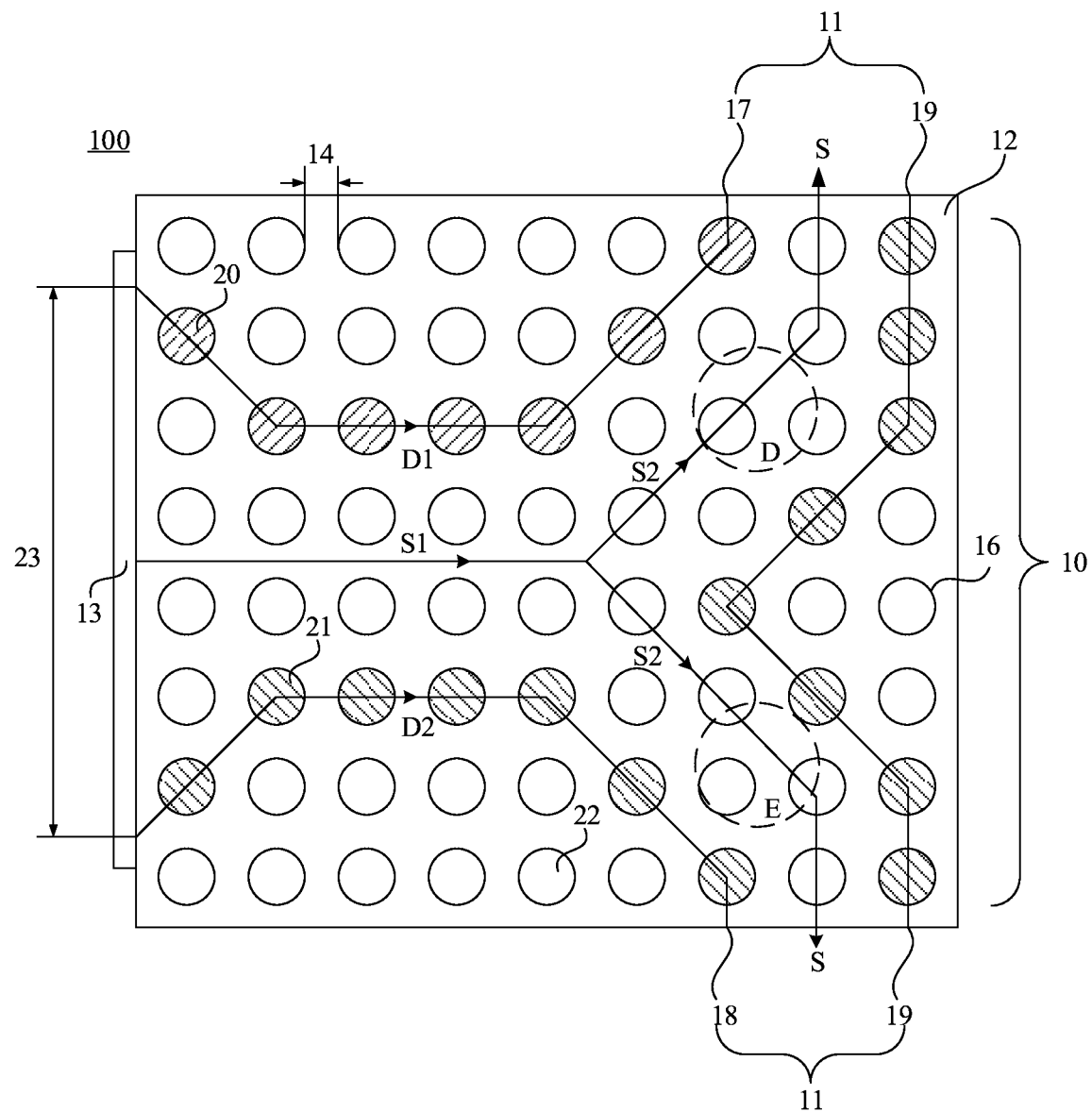
FIG. 13 is a schematic view of a ventilation wall group and a flow path of the heat dissipation device according to the first embodiment of the present disclosure, in which two heat sources positions of the terminal are located at positions D and E.
Figure 14:
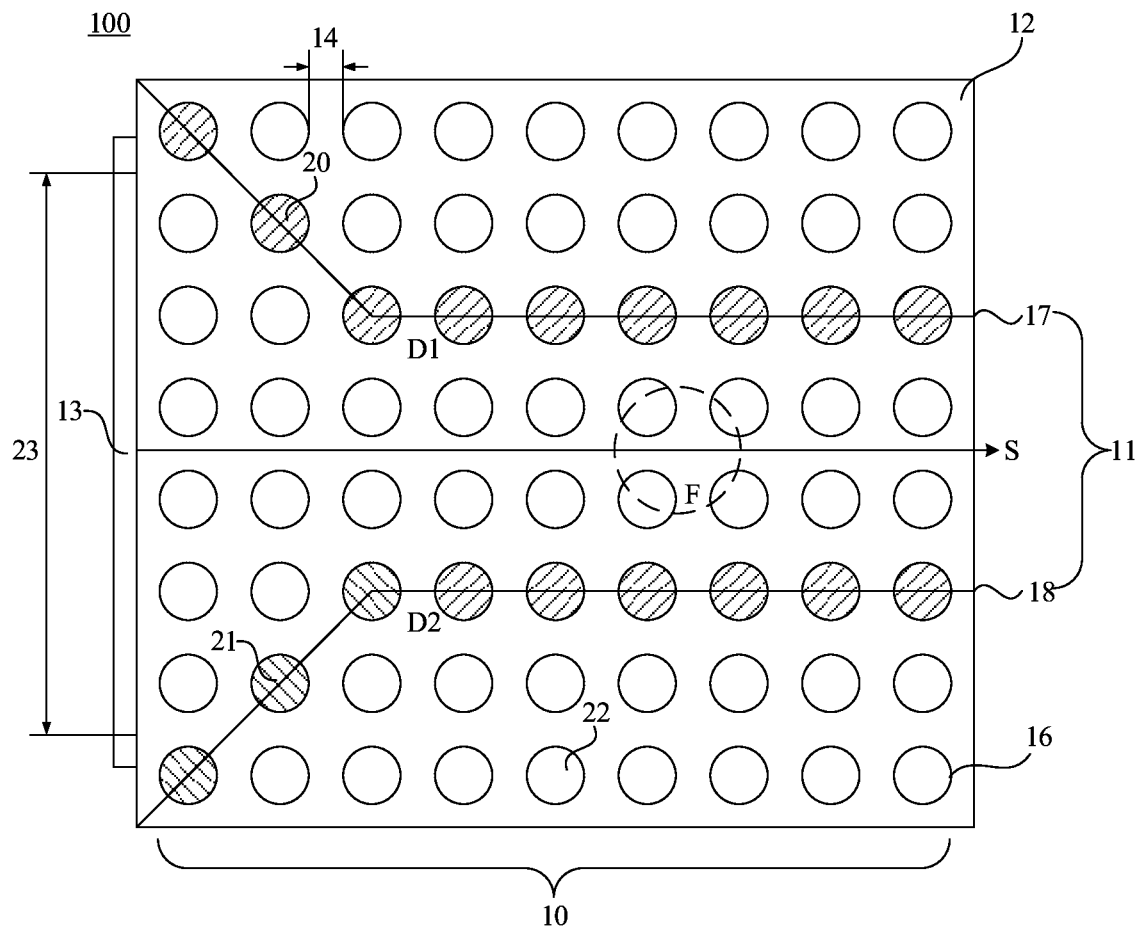
FIG. 14 is a schematic view of a ventilation wall group and a flow path of the heat dissipation device according to the first embodiment of the present disclosure, in which a heat source position of the terminal is located at a position F.
Figure 15:
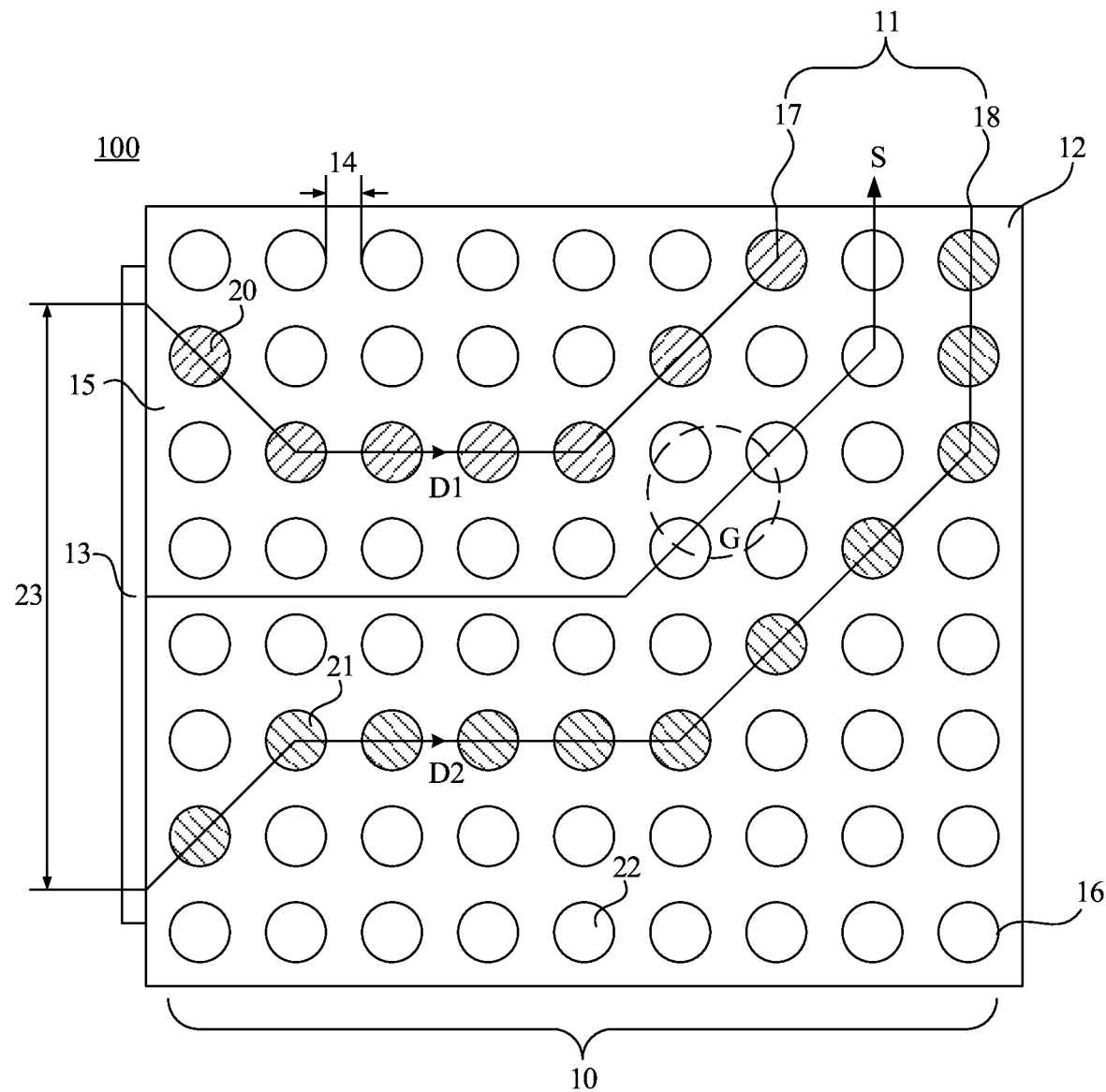
FIG. 15 is a schematic view of a ventilation wall group and a flow path of the heat dissipation device according to the first embodiment of the present disclosure, in which a heat source position of the terminal is located at a position G.
Figure 16:
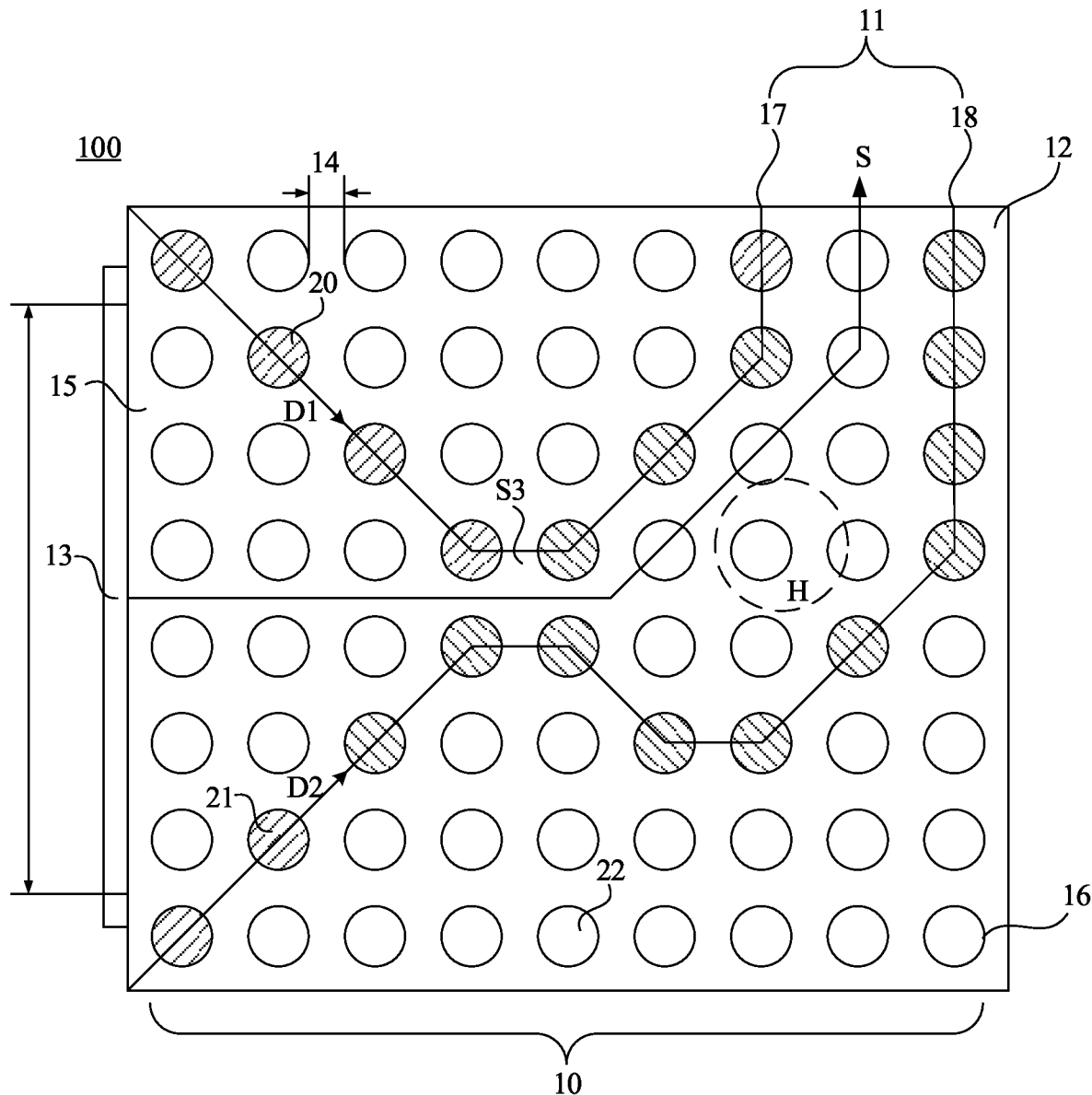
FIG. 16 is a schematic view of a ventilation wall group and a flow path of the heat dissipation device according to the first embodiment of the present disclosure, in which a heat source position of the terminal is located at a position H.

Referring to FIG. 11, when the heat source position is located at a position B, the ventilation wall group 11 of the variable ventilation wall assembly 10 extends from the left side to a top right corner of the support plate 12. The heat dissipation airflow generated by the fan 13, which is located at the left side of the support plate 12, flows through the flow path S to the top right corner of the support plate 12 to perform the heat dissipation at the heat source position B, and finally flows out from an upper side of the support plate 12. As shown in FIG. 12, when the heat source position is located at a position C, the ventilation wall group 11 of the variable ventilation wall assembly 10 extends from the left side to a bottom right corner of the support plate 12. The heat dissipation airflow generated by the fan 13, which is located at the left side of the support plate 12, flows through the flow path S to the bottom right corner of the support plate 12 to perform the heat dissipation at the heat source position C, and finally flows out from the lower side of the support plate 12. As shown in FIG. 13, when two heat source positions are detected, i.e. heat source positions D and E, the ventilation wall groups 11 of the variable ventilation wall assembly 10 extend from the left side to the top and bottom right corners of the support plate 12, respectively. In this case, a portion of the flow path S in communication with the fan 13 is a main flow path S1, and portions of the flow path S passing through the positions D and E are two branch flow paths S2. The heat dissipation airflow generated by the fan 13 flows into the flow path S from the main flow path S1 and then is branched into the two branch flow paths S2, so as to flow through the heat sources positions D and E, respectively. Thus, partial heat dissipations are performed simultaneously. As shown in FIG. 14, the flow path S extends from the left side to the right side of the support plate 12. In this case, the flow path S has a shape with a wide inlet and a narrow outlet, which is beneficial to increase a flow rate of the heat dissipation airflow at a heat source position F. As shown in FIG. 15, the portion of the flow path S in communication with the fan 13 is an air inlet 15. Further, the air inlet 15 has a diameter gradually decreasing along the extending direction of the flow path S, thereby introducing more heat dissipation airflow to a heat source position G. As shown in FIG. 16, a narrowed portion S3 is formed between the air inlet 15 of the flow path S and a heat source position H, and has an inner diameter which is significantly less than those of the flow path S at the air inlet 15 and the heat source position H. The narrowed portion S3 is suitable to increase the flow rate of the heat dissipation airflow before the heat dissipation airflow flows to the heat dissipation position H, thereby increasing the heat dissipation efficiency at the heat source position H. In an embodiment, the narrowed portion S3 may extend to the heat source position H, as long as the inner diameter of the narrowed portion S3 is greater than a size of a portion of the flow path S at the heat source position H. With reference to FIGS. 11 to 16, when the heat source position is changed, the extending direction of the ventilation wall group 11 of the variable ventilation wall assembly 10 is changed, so that the flow path S in the ventilation wall group 11, along which the heat dissipation airflow flows, is also changed. For example, when detecting a plurality of different heat source positions, the flow path S may be branched into a plurality of branch flow paths S2 to meet the heat dissipation requirements of each of the plurality of heat source positions. In this case, the number of the branch flow paths S2 is determined based on the number of the detected heat source positions in the actual application, and is not limited to the two branch flows S2 in the embodiment shown in FIG. 13. Hence, regardless the position of the heat source, the variable ventilation wall assembly 10 can always form the ventilation wall group 11 extending in the desired direction to generate the desired flow path S passing through the heat source position, so that the heat dissipation airflow can dissipate the heat generated at the heat source position. In the heat dissipation device 100 according to the first embodiment of the present disclosure, the variable ventilation wall assembly 10 is capable of changing a common entire heat dissipation mode into a local heat dissipation mode, and the heat dissipation airflow generated by the fan 13 is converged by the ventilation wall group 11 of the variable ventilation wall assembly 10 and then flow along the flow path S to the heat source position, which is beneficial to guide the heat dissipation airflow and dissipate the heat. The heat dissipation device 100 has a high heat dissipation efficiency and a good heat dissipation effect, and is applicable to various heat dissipation requirements and can improve the user experience.

In the heat dissipation device 100 according to the first embodiment of the present disclosure, the variable ventilation wall assembly 10 includes a plurality of blocking member groups 16 arranged on the support plate 12 in an array, and the support plate 12 is configured to carry the blocking member groups 16. The plurality of blocking member groups 16 is located at different positions in a plane, and a gap 14 is formed between two adjacent blocking member groups 16. In some embodiments, due to a layout of the electronic devices in the terminal, it is not suitable to arrange the blocking member group 16 at each position inside the terminal, as long as the ventilation wall group 11 formed by the blocking member groups 16 provides the heat dissipation at each of potential heat source positions in the terminal. The gap 14 between the two adjacent blocking member groups 16 allows the heat dissipation airflow to flow therethrough without being blocked by the blocking member groups 16, which may affect the heat dissipation at the heat source position.

As shown in FIGS. 11 to 16, each of the ventilation wall groups 11 includes a first ventilation wall 17 and a second ventilation wall 18, which are configured to define the flow path S to allow the heat dissipation airflow to flow to the heat source position for the heat dissipation. The first ventilation wall 17 and/or the second ventilation wall 18 in different ventilation wall groups 11 are different in position and/or shape. Compared FIG. 11 with FIG. 12, the first ventilation wall 17 located at an upper portion of the support plate 12 of FIG. 11 is different from the first ventilation wall 17 located at a middle portion of the support plate 12 of FIG. 12 in position, shape and extending direction, and the second ventilation wall 18 located on a lower middle portion of the support plate 12 of FIG. 11 is different from the second ventilation wall 18 located at a lower left portion of the support plate 12 of FIG. 12 in position, shape and extending direction. This is because the heat source position is changed from the position B in FIG. 11 to the position C in FIG. 12. In this case, the extending direction of the flow path S is required to be changed greatly to satisfy the heat dissipation requirement on the heat source position C in FIG. 12. In some embodiments of the present disclosure, different heat source positions may be in the same flow path S. In this case, the first ventilation walls 17 and the second ventilation walls 18 of different ventilation wall groups 11 may be the same to each other in position and shape. In some embodiments of the present disclosure, when the different heat source positions are close to each other, only the first ventilation walls 17 or the second ventilation walls 18 of different ventilation wall groups 11 may be different from each other in position and shape. In some embodiments of the present disclosure, the first ventilation walls 17 or the second ventilation walls 18 of the different ventilation wall groups 11 may have the same shape at different positions, such as a linear shape. In some embodiments, the first ventilation walls 17 or the second ventilation walls 18 of different ventilation wall groups 11 may have different shapes at the same position. For example, they may be located at the upper portion of the support plate 12, and one of the first ventilation walls 17 is in a V-shape and another of the first ventilation walls 17 is in a U-shape. In FIG. 13, the ventilation wall group 11 further includes a third ventilation wall 19. The main flow path S1 is defined by the first ventilation wall 17 and the second ventilation wall 18 at a side close to the air inlet 15, and the two branch flow paths S2 are defined by the first ventilation wall 17 and the third ventilation wall 19 as well as the second ventilation wall 18 and the third ventilation wall 19, respectively. When one heat source position is increased into two heat source positions, a portion of the first ventilation wall 17 or the second ventilation wall 18 is reformed near a newly detected heat source position. In this case, the new third ventilation wall 19 is formed between the two heat source positions to branch into the two branch flow paths S2. In FIGS. 14, 15 and 16, the first ventilation wall 17 is different from the second ventilation wall 18 in position, shape and extending direction. Specifically, the first ventilation wall 17 and the second ventilation wall 18 shown in FIG. 14 form a relatively simple structure, the first ventilation wall 17 and the second ventilation wall 18 shown in FIG. 16 form a relatively complicated structure, and the complexity of a structure formed by the first ventilation wall 17 and the second ventilation wall 18 shown in FIG. 15 is between those shown in FIG. 14 and FIG. 16.

Operation states of the heat dissipation device 100 includes a first operation state. When the at least one heat source position is detected, the blocking member groups 16 for forming the ventilation wall group 11 is selected. When these blocking member groups 16 forms the first ventilation wall 17 and the second ventilation wall 18, the heat dissipation device 100 is prepared for the first operation state. In the first operation state, the plurality of blocking member groups 16 has a plurality of first partial blocking member groups 20 (as indicated by circles filled with right oblique lines), a plurality of second partial blocking member groups 21 (as indicated by circles filled with left oblique lines), and a plurality of third partial blocking member groups 22 (as indicated by circles without oblique lines). Since a part of the blocking member groups 16 form the first ventilation wall 17 and the second ventilation wall 18, the support plate 12 is divided into three regions by the first ventilation wall 17 and the second ventilation wall 18. Specifically, a region located between the first ventilation wall 17 and the second ventilation wall 18 is the flow path S, and regions outside the first ventilation wall 17 and the second ventilation wall 18 are regions that do not require the heat dissipation. In the plurality of blocking member groups 16 arranged on the support plate 12, the blocking member groups 16 for forming the first ventilation wall 17 are the first partial blocking member groups 20, the blocking member groups 16 for forming the second ventilation wall 18 are the second partial blocking member groups 21, and the blocking member groups 16 located in at least one of the three regions are the third partial block member groups 22. The plurality of first partial blocking member groups 20 is continuously arranged in a first direction D1, and two adjacent first partial blocking member groups 20 are in contact with each other to block the gap 14, to form the first ventilation wall 17. The plurality of second partial blocking member groups 21 is continuously arranged in a second direction D2, and two adjacent second partial blocking member groups 21 are in contact with each other to block the gap 14, so as to form the second ventilation wall 18. The first ventilation wall 17 extends in the first direction D1, and the second ventilation wall 18 extends in the second direction D2. Further, the third partial blocking member groups of the plurality of third partial blocking member groups 22 are disposed in seven arrangements. Specifically, the third partial blocking member groups 22 may be arranged in the flow path S or outside the first ventilation wall 17 and/or the second ventilation wall 18, and two adjacent third partial blocking member groups 22 are spaced at the gap 14, the third partial blocking member group 22 and the first partial blocking member group 20 that are adjacent to each other are spaced at the gap 14, and the third partial blocking member group 22 and the second partial blocking member group 21 that are adjacent to each other are spaced at the gap 14. That is, the third partial blocking member groups 22 are not in operation, and only the first partial blocking member groups 20 are connected to each other to form the first ventilation wall 17, and the second partial blocking member groups 21 are connected to each other to form the second ventilation wall 18. A space 23 is formed between the first ventilation wall 17 and the second ventilation wall 18. The space 23 is equal to or greater than the gap 14 to ensure that the flow path S can normally allow the heat dissipation airflow to flow therethrough. When the terminal is operated by a user, the heat dissipation device 100 starts to detect the heat source position. If the heat source position is detected, the heat dissipation device 100 operates in the first operation state. After selecting the first partial blocking member groups 20 for forming the first ventilation wall 17 and the second partial blocking member groups 21 for forming the second ventilation wall 18 based on the heat source position, the first partial blocking member groups 20 are connected to each other to form the first ventilation wall 17, and the second partial blocking member groups 21 are connected to each other to form the second ventilation wall 18. If completion of the heat dissipation operation at the heat source position is detected, the first partial blocking member groups 20 are separated from each other and the second partial blocking member groups 21 are separated from each other, so that the first ventilation wall 17 and the second ventilation wall 18 are removed and the heat dissipation device 100 returns back to an initial state. At this time, the heat source position is continuously detected. When another heat source position is detected, the heat dissipation device 100 is switched into the first operation state in which another first ventilation wall 17 and another second ventilation wall 18 are formed to dissipate the heat from the another heat source position. The heat dissipation device 100 according to the first embodiment of the present disclosure can modify the common entire heat dissipation, and form the temporary first ventilation wall 17 and second ventilation wall 118 through the mutual contact and separation of a part of the blocking member groups 16 based on the heat source position, so as to achieve the local heat dissipation. Further, the heat dissipation device 100 according to the first embodiment of the present disclosure is applicable to any situation where the heat dissipation is required, and has the good heat dissipation effect and the high heat dissipation efficiency.

Figure 17:
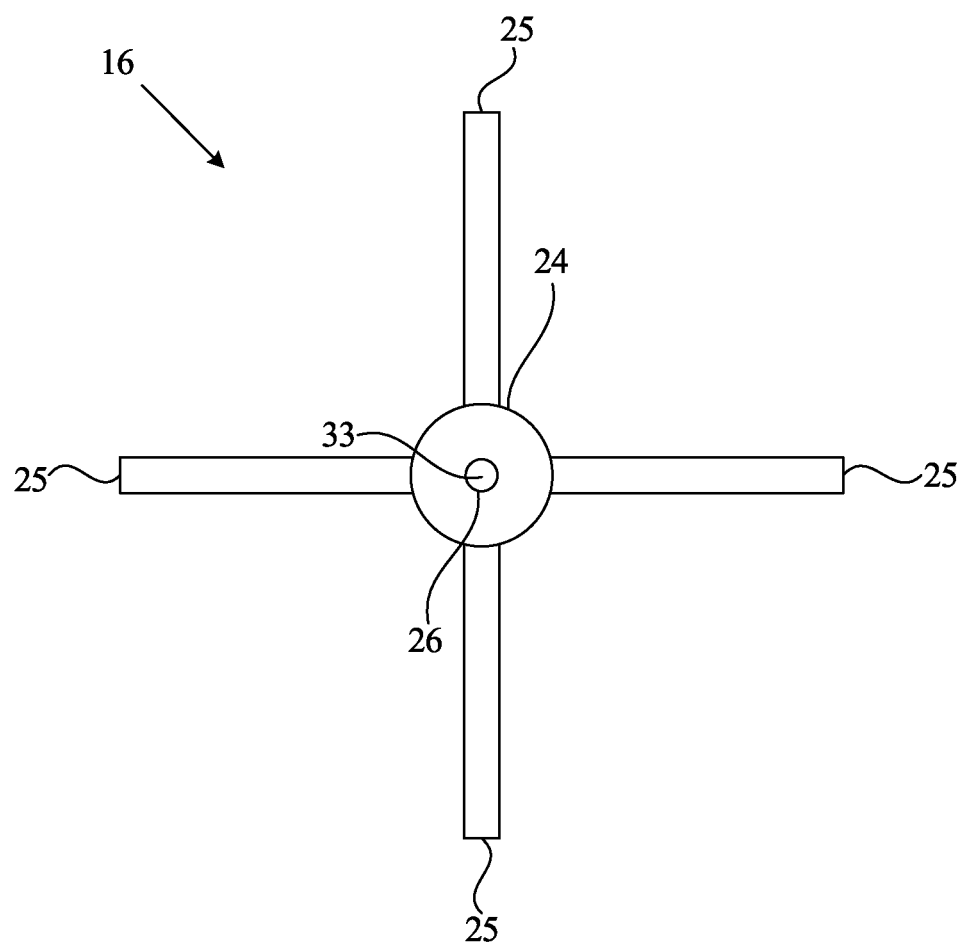
FIG. 17 is a schematic structural view of the heat dissipation device with a blocking member group provided with four blocking members according to the first embodiment of the present disclosure, in which the four blocking members are in a retracted state.
Figure 21:
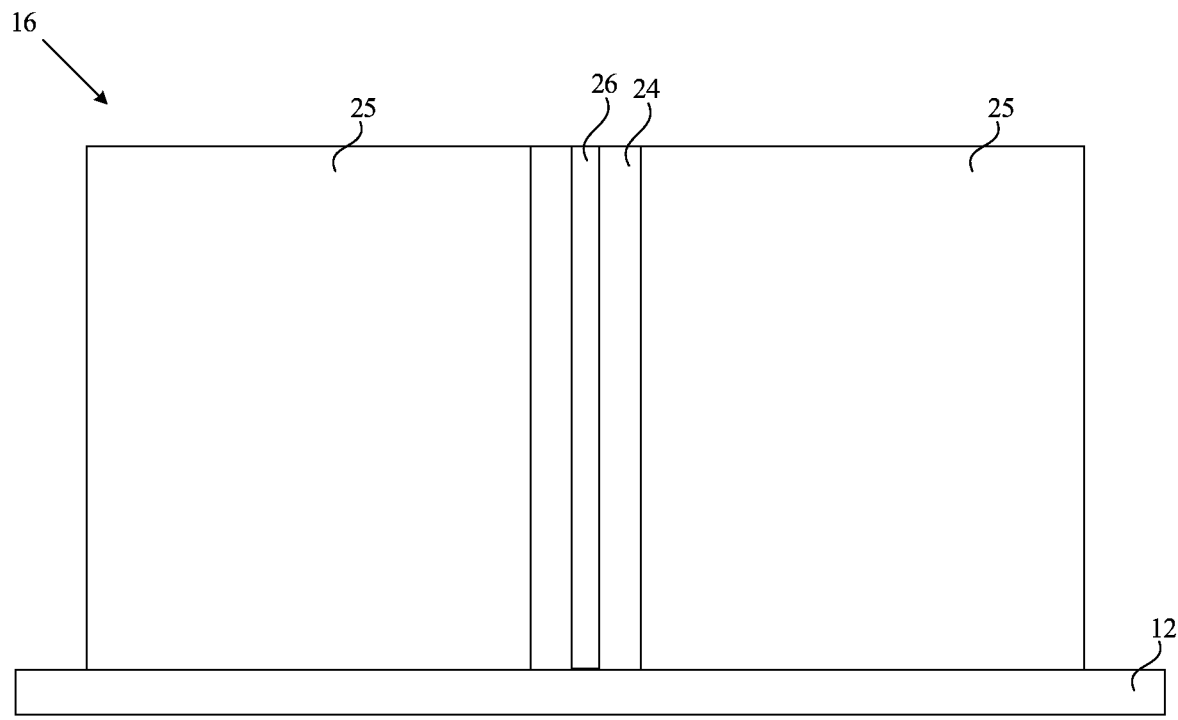
FIG. 21 is a schematic side view showing the structure of the heat dissipation device according to the first embodiment of the present disclosure, in which the blocking member group is in the retracted state.

Referring to FIGS. 1 to 16, in the heat dissipation device 100 according to the first embodiment of the present disclosure, the blocking member groups of the plurality of blocking member groups 16 are arranged in the array on the support plate 12. As shown in FIG. 17, each of the blocking member groups 16 includes a blocking post 24 and a plurality of blocking members 25. Referring to FIG. 21, in each blocking member group 16, the blocking post 24 is fixed on the support plate 12, and a central axis 26 of the blocking post 24 is perpendicular to the support plate 12. Further, the plurality of blocking members 25 is installed on the blocking post 24 and extends in different directions parallel to a plane of the terminal.

In some embodiments of the present disclosure, distances between every two adjacent blocking posts 24 of the blocking member groups 16 may be different from each other. In some embodiments of the present disclosure, the distances between every two adjacent blocking posts 24 of the blocking member groups 16 may be the same with each other. However, the distance between the two adjacent blocking posts 24 is not less than the gap 14 between the two adjacent blocking member groups 16. That is, the distance between the two adjacent blocking posts 24 is greater than or equal to the gap 14 between the two adjacent blocking member groups 16.

Figure 23:
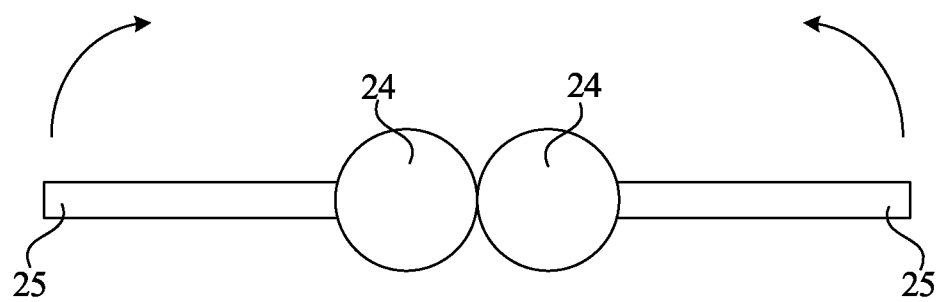
FIG. 23 is a schematic structural view of the heat dissipation device according to the first embodiment of the present disclosure, in which each blocking member of the blocking member group has a rotatable structure.

In some embodiments of the present disclosure, the number of the blocking members 25 installed on each blocking post 24 may be the same. In some embodiments of the present disclosure, the number of the blocking members 25 installed on each blocking post 24 may be different. In some embodiments of the present disclosure, angles formed between two adjacent blocking members 25 on the same blocking post 24 may be the same with each other. In some embodiments of the present disclosure, the angles formed between two adjacent blocking members 25 on the same blocking post 24 may be different from each other. In general, the blocking members 25 are not rotatable in a circumferential direction around the central axis 26 of the blocking post 24. That is, the blocking members 25 are usually movable in a radial direction passing through the central axis 26 of the blocking post 24. For example, the blocking members 25 may be extended and retracted in the radial direction, or may be displaceable in the radial direction. In some embodiments of the present disclosure, the blocking members 25 may be rotatable around the central axis 26 of the blocking post 24, as shown in FIG. 23. In this case, the two adjacent blocking posts 24 abut against each other, the angle formed between the blocking members 25 on the two adjacent blocking posts 24 is variable, and the blocking members 25 can rotate in directions indicated by arrows. Further, the blocking members 25 may be rotated to a suitable angle based on different heat source positions, to form required ventilation wall groups. However, regardless of the application of the heat dissipation device 100, the blocking members 25 may be disposed in various arrangements on the blocking post 24, as long as two blocking members 25 of the two adjacent blocking member groups 16 can contact with each other by rotating, extending and retracting, sliding and the like to block the gaps 14 and the plurality of blocked gaps 14 can form the first ventilation wall 17 or the second ventilation wall 18.

Figure 18:
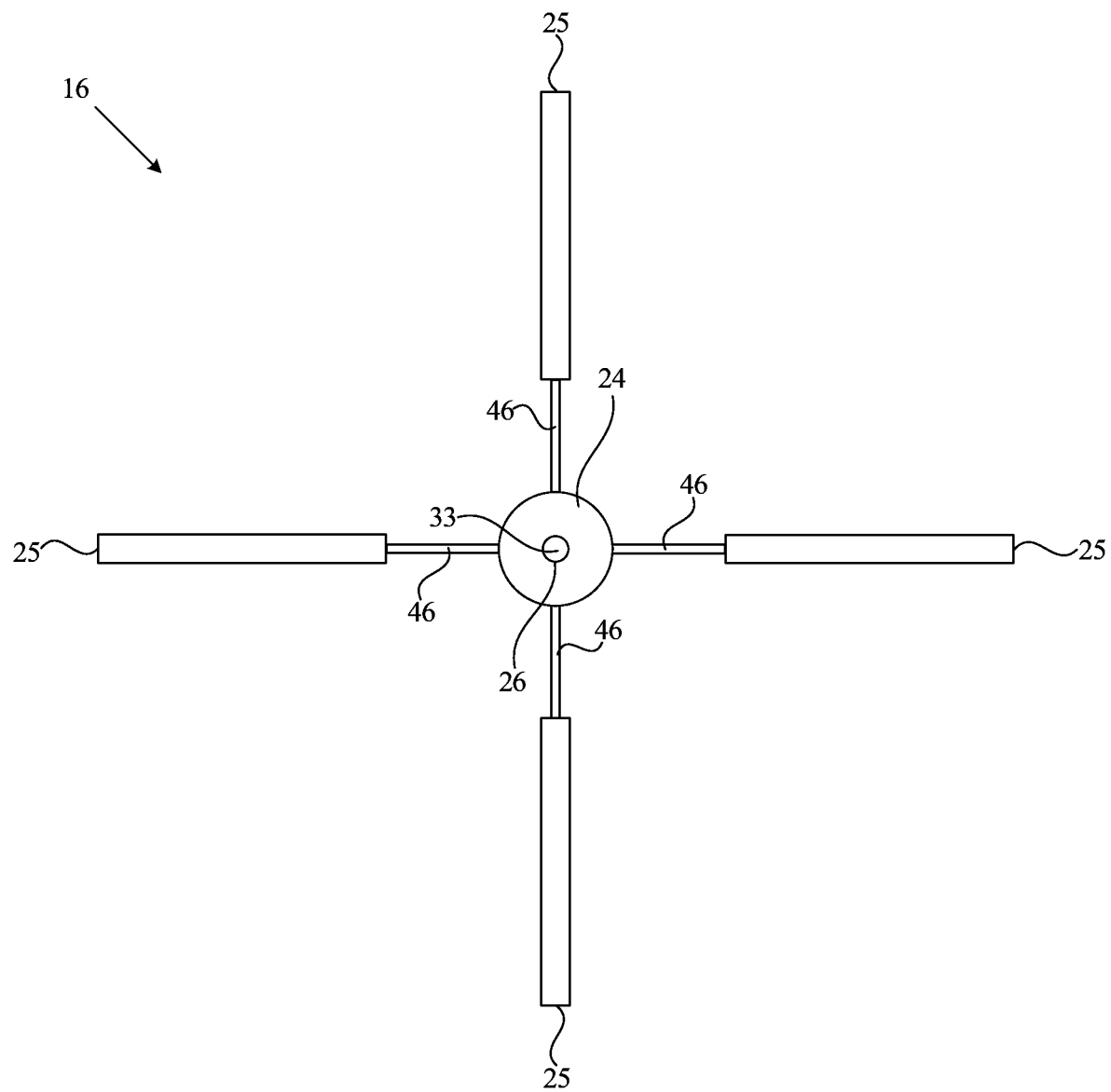
FIG. 18 is a schematic structural view of the heat dissipation device with the blocking member group provided with the four blocking members according to the first embodiment of the present disclosure, in which the four blocking members are in an extended state.
Figure 19:
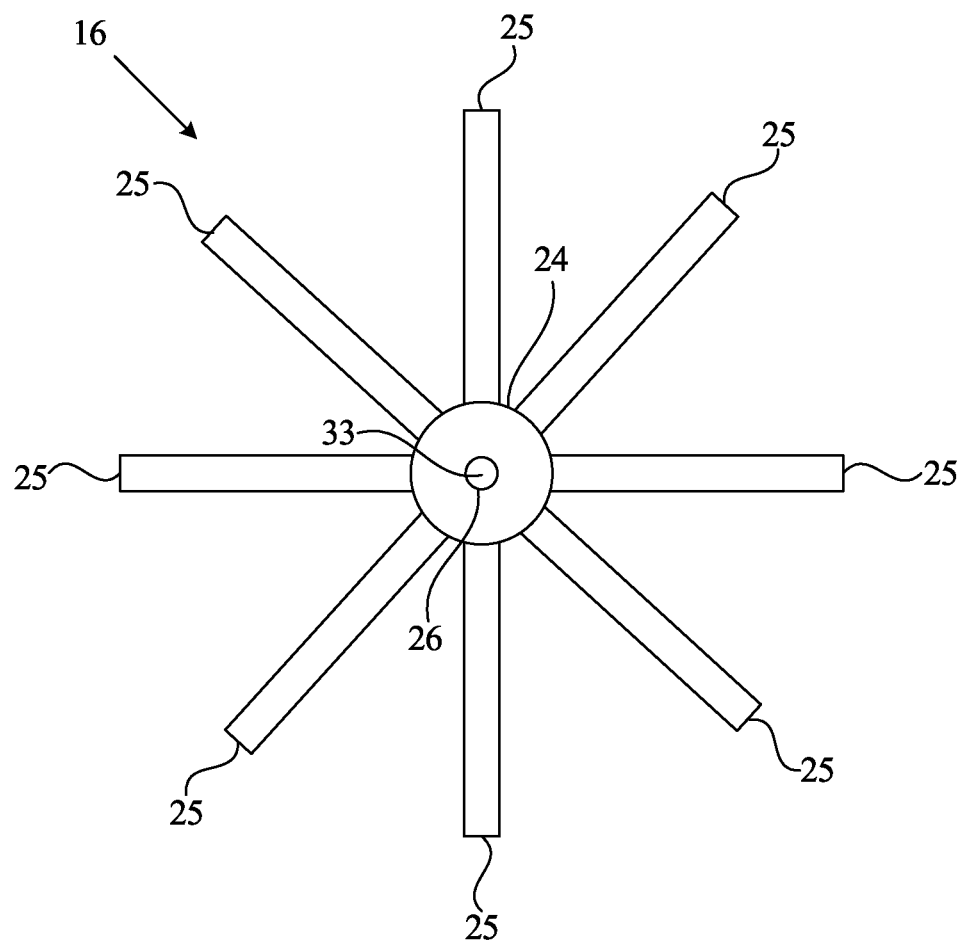
FIG. 19 is a schematic structural view of the heat dissipation device with a blocking member group provided with eight blocking members according to the first embodiment of the present disclosure, in which the eight blocking members are in a retracted state.
Figure 20:
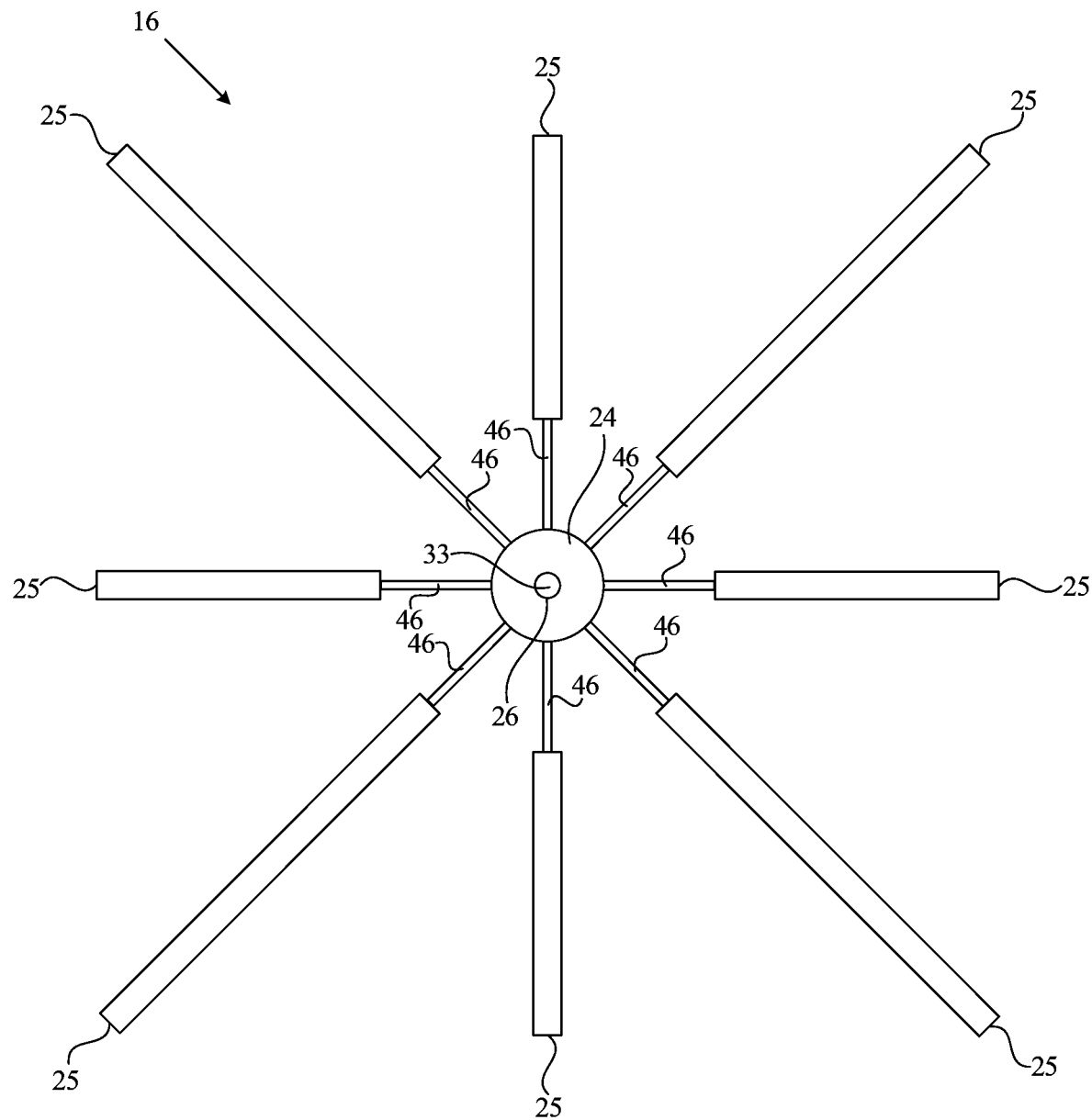
FIG. 20 is a schematic structural view of the heat dissipation device with the blocking member group provided with the eight blocking members according to the first embodiment of the present disclosure, in which the eight blocking members are in an extended state.
Figure 22:
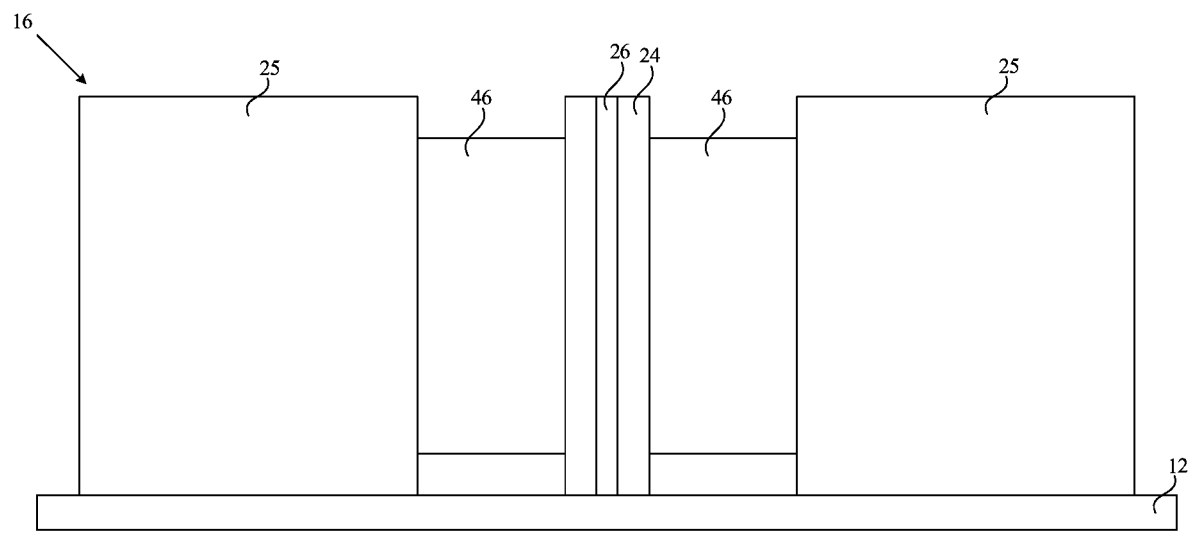
FIG. 22 is a schematic side view showing the structure of the heat dissipation device according to the first embodiment of the present disclosure, in which the blocking member group is in the extended state.
Figure 24:
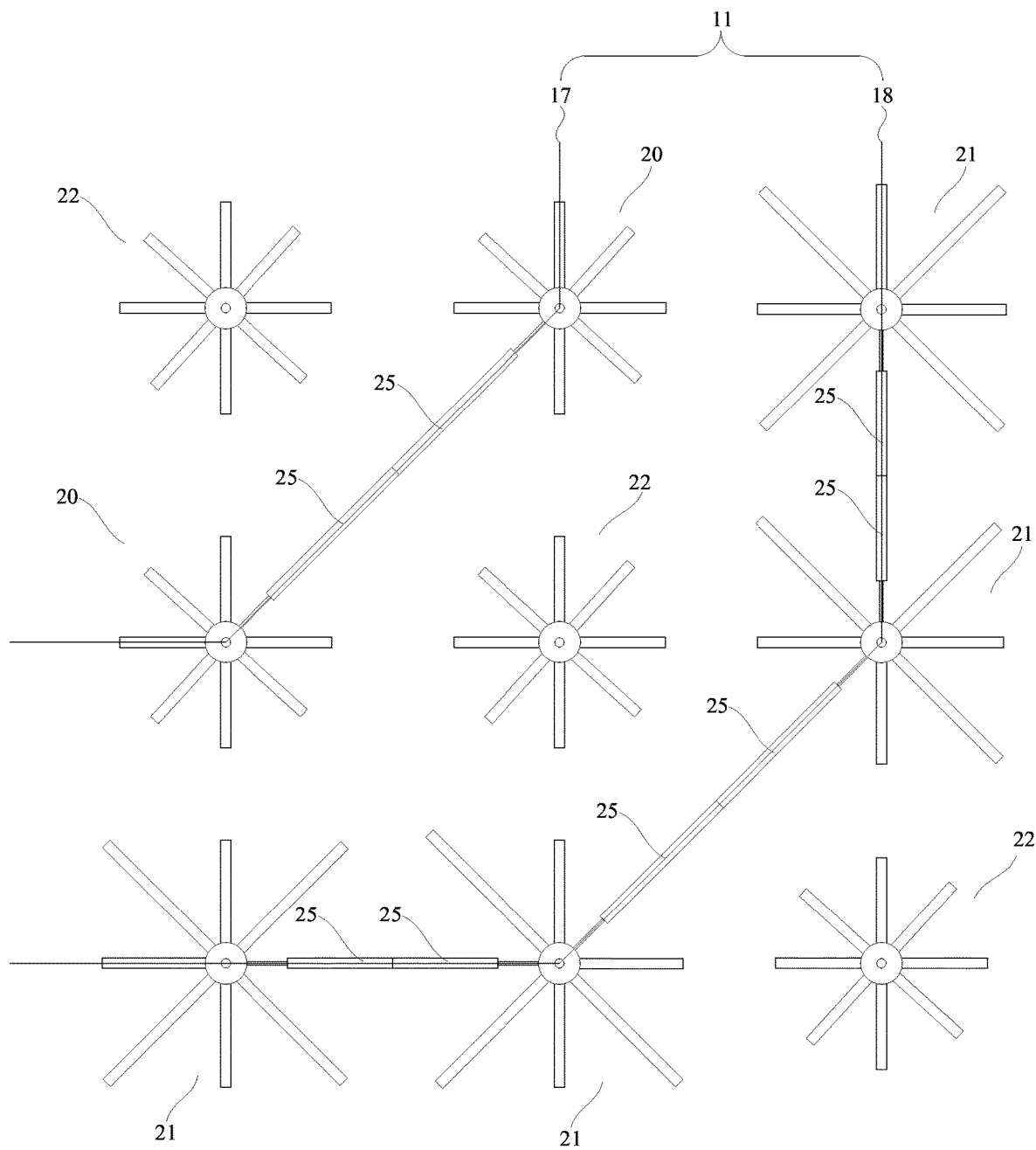
FIG. 24 is a schematic view of a state in which the blocking member group forms the ventilation wall group in the heat dissipation device according to the first embodiment of the present disclosure.
Figure 25:
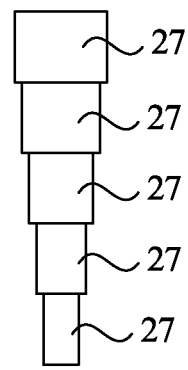
FIG. 25 is a schematic structural view of the heat dissipation device according to the first embodiment of the present disclosure, in which each blocking member of the blocking member group has a sleeve structure.
Figure 26:
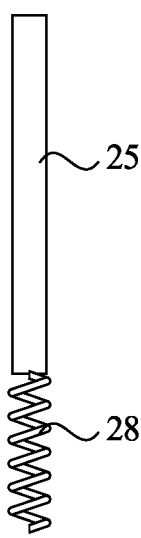
FIG. 26 is a schematic structural view of the heat dissipation device according to the first embodiment of the present disclosure, in which each blocking member of the blocking member group is an elastic member.

Referring to FIGS. 17 and 18, in some embodiments of the present disclosure, each of the blocking member groups 16 may have four blocking members 25. In this case, the angle between two adjacent blocking members 25 is 90°, and the four blocking members 25 are equally spaced around the blocking post 24. Thus, the blocking member group 16 has a cross shape when viewed in a plan view thereof. Referring to FIGS. 19 and 20, in some embodiments of the present disclosure, each of the blocking member groups 16 may have eight blocking members 25. In this case, the angle between two adjacent blocking members 25 is 45°, and the eight blocking members 25 are equally spaced around the blocking post 24s. Thus, the blocking member group 16 has a cross and saltire shape when viewed in a plan view thereof. In the two embodiments shown in FIGS. 17 to 18 and FIGS. 19 to 20, the blocking members 25 may move in an extending direction thereof. For example, the blocking members 25 may be extended and retracted, or may be slidable. In the blocking member groups 16 that are not required to form the ventilation walls, the blocking members 25 are in a fully retracted state, as shown in FIGS. 17, 19 and 21. In the blocking member groups 16 for forming the ventilation walls, the blocking members 25 are in a fully extended state and connected to the blocking post 24 by connection rods 46, as shown in FIGS. 18, 20 and 22. After the ventilation wall group 11 is formed, in the blocking member groups 16 for forming the first ventilation wall 17 and the second ventilation wall 18, some of the blocking members 25 are extended and contact with the adjacent blocking members 25, and the other blocking members 25 are in the retracted state, as shown in FIG. 24. In some embodiments of the present disclosure, each of the blocking members 25 may have a sleeve structure. For example, as shown in FIG. 25, the blocking member 25 includes a plurality of blocking sub-members 27 sequentially nested in the extending direction thereof, and two adjacent blocking sub-members 27 are movable relative to each other. The advantage of the sleeve structure is in that the gaps 14 between the blocking member groups 16 in FIG. 1 can be relatively large, so that the number of the blocking member groups 16 arranged on the support plate 12 can be reduced. In this way, the cost is reduced, and more space is provided for the heat dissipation airflow. In some embodiments of the present disclosure, each of the blocking members 25 may be slidable by an elastic member 28. For example, as shown in FIG. 26, a plurality of elastic members 28 are provided to be connected with the blocking members 25. Each of the elastic members 28 is deformable in the extending direction of the respective blocking member 25. Referring to FIGS. 1 and 24 again, when the blocking members 25 are extended to be in contact with each other to block the gap 14, the formed ventilation wall group 11 is more stable and stronger since the elastic members 28 exert elastic forces on contact surfaces of the blocking members 25. Further, when the blocking members 25 are required to be separated from each other, the elastic members 28 can quickly pull back the blocking members 25, thereby facilitating the rapid formation of a new ventilation wall group 11 and improving the heat dissipation efficiency.

When the heat dissipation device 100 operates in the first operation state as described above, the blocking member groups 16 on the support plates 12 are divided into three parts. Specifically, the blocking member groups 16 for forming the first ventilation wall 17 are the first partial blocking member groups 20, the blocking member groups 16 for forming the second ventilation wall 18 are the second partial blocking member groups 21, and the blocking member groups 16 that do not form the ventilation wall are the third partial blocking member groups 22. In the first partial blocking member groups 20, the blocking members 25 of one of the first partial blocking member groups 20 that extend in the first direction D1 are extended to be in contact with the blocking members 25, which are extended in the first direction D1, of the adjacent first partial blocking member groups 20. In the second partial blocking member groups 21, the blocking members 25 of one of the second partial blocking member groups 21 that extend in the second direction D2 are extended to be in contact with the blocking members 25, which are extended in the second direction D2, of the adjacent second partial blocking member groups 21. In the third partial blocking member groups 22, the blocking members 25 are in the retracted state and are not in contact with the blocking members 25 of the first partial blocking member groups 20 and the blocking members 25 of the second partial blocking member groups 21, to avoid the heat dissipation airflow from being blocked.

Figure 27:
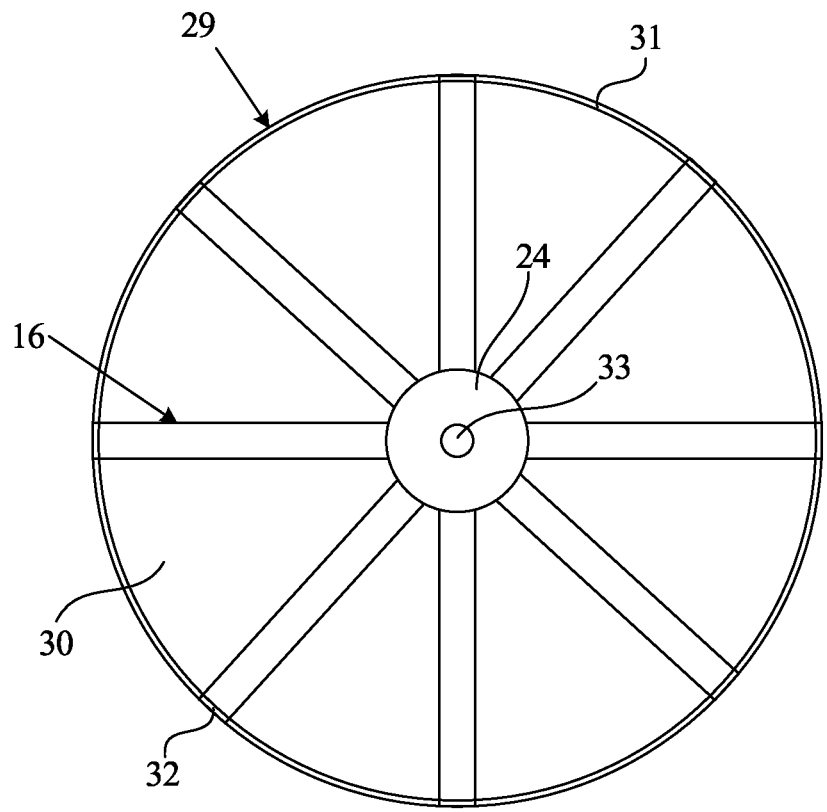
FIG. 27 is a schematic structural view of the heat dissipation device with the blocking member group received in a first receiving member according to the first embodiment of the present disclosure.

Referring to FIG. 27, each of the blocking member groups 16 in FIG. 1 is provided with a first receiving member 29 that includes a cavity 30 and a housing 31 at least partially enclosing the cavity 30. The housing 31 includes a plurality of guiding holes 32 in communication with the cavity 30, and the blocking member group 16 is located in the cavity 30. The terminal is supported by the housing 31. An end of each blocking member 25 can be moved to outside of the housing 31 or inside of the cavity 30 through the respective guiding hole 32. Compared with FIGS. 17 to 26, the blocking member group 16 in FIG. 27 is not exposed and received within the cavity 30 by the first receiving member 29. The first receiving member 29 can protect the blocking member group 16 and prevent the blocking member group 16 from being exposed to foreign material such as dust. In the first receiving member 29, the housing 31 is configured to support the terminal while protecting the blocking member group 16. Further, the guiding holes 32 in the housing 31 provides accommodation spaces and movable passages for the blocking members 25, such that the blocking members 25 can be extended and retracted or slid in the guiding holes 32. Each of the guiding holes 32 has a size matching with that of the respective blocking member 25, so that the blocking member 25 cannot move when forming the ventilation wall, which may affect the heat dissipation. With reference to FIGS. 17 to 26, the blocking members 25 in the first receiving member 29 shown in FIG. 27 are equally spaced in a circumferential direction of the first receiving member 29. Accordingly, the guiding holes 32 are equally spaced in the circumferential direction of the first receiving member 29. The first receiving member 29 may have a cube shape, a cylinder shape, or any other shape that can obtain the structure as described above without affecting the heat dissipation of the heat dissipation device 100.

Figure 28:
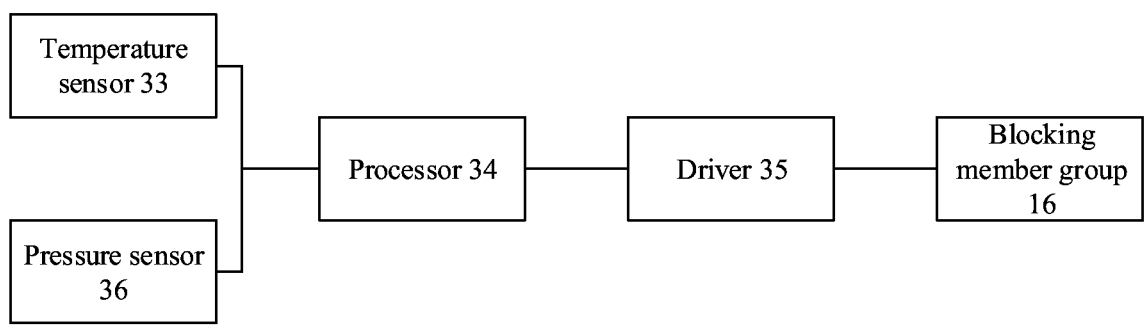
FIG. 28 is a schematic view of a control system of the heat dissipation device according to the first embodiment of the present disclosure.

Referring to FIG. 28, in the heat dissipation device 100 according to the first embodiment of the present disclosure, the variable ventilation wall assembly 10 includes a temperature sensor 33, a processor 34 and a driver 35. In FIGS. 17 to 20, the temperature sensor 33 is located at an end surface of the blocking post 24. The temperature sensor 33 is located at an end surface of the housing 31 in FIG. 27. The temperature sensor 33 is configured to sense temperature at different positions and transmit the sensed temperature to the processor 34. The processor 34 is configured to, based on a preset temperature condition, obtain the heat source position in the terminal that meets the preset temperature condition, to obtain ventilation wall information corresponding to the heat source position and the temperature at the heat source position based on a preset ventilation wall condition, and to transmit the ventilation wall information to the driver 35. The driver 35 is configured to drive the blocking members 25 to move based on the ventilation wall information. Further, the ventilation wall information may include position information and shape information of the ventilation wall group 11 to be formed (with reference to FIGS. 11 to 16). In the heat dissipation device 100 according to the first embodiment as shown in FIG. 1, the variable ventilation wall assembly 10 further includes a pressure sensor 36. As shown in FIG. 28, the blocking members 25 can be electrically controlled by the temperature sensor 33, the pressure sensor 36, the processor 34 and the driver 35, so that the ventilation wall group 11 is intelligently formed. The temperature sensor 33 is installed at a side of the housing 31 of the first receiving member 29 close to the terminal, i.e., a side of the housing 31 away from the support plate 12. The pressure sensor 36 is installed on the respective blocking member 25, and the processor 34 and the driver 35 are integrated in the support plate 12. Further, the temperature sensor 33 and the pressure sensor 36 are communicatively connected with the processor 34, and the processor 34 is communicatively connected with the driver 35. The temperature sensor 33 is configured to sense temperature at different positions of the terminal and transmit the sensed temperature to the processor 34. The pressure sensor 36 is configured to sense a pressure applied on the end of the blocking member 25 and transmit the sensed pressure to the driver 35. The processor 34 is configured to obtain the heat source position in the terminal that meets the preset temperature condition based on the preset temperature condition, to obtain the ventilation wall information corresponding to the heat source position and the temperature at the heat source position based on the preset ventilation wall condition, and to transmit the ventilation wall information to the driver 35. The driver 35 is configured to drive the blocking members 25 to move based on the ventilation wall information and to stop the movement of the blocking members based on a preset pressure condition. Further, the preset temperature condition and the preset pressure condition are conditions that are preset based on the usage and performance of the terminal and stored in the processor 34. The preset temperature condition specifically refers to a critical temperature. When detecting that a temperature at a position is greater than the critical temperature, this position is defined as a heat source position. In at least one embodiment, temperature data of various positions is collected periodically, and a position at a highest temperature is defined as the heat source position. The preset pressure condition specifically refers to a critical pressure. When a pressure applied on the end of the blocking member 25 is sensed to be greater than the critical pressure, the blocking member 25 is not driven by the driver 35 so that the blocking member cannot further move. The preset ventilation wall condition is the ventilation wall information of the first ventilation wall 17 and the second ventilation wall 18 that is preset based on potential heat source positions in the terminal and stored in the processor 34. Further, the ventilation wall information includes the position information and shape information of the ventilation wall group 11 to be formed. Furthermore, the position information refers to position information corresponding to the blocking member groups 16 that are required to be driven to form the ventilation wall groups 11, and the shape information refers to the first partial blocking member groups 20 for forming the first ventilation wall 17 and the second partial blocking member groups 21 for forming the second ventilation wall 18 of blocking member groups 16, which are selected from the preset single ventilation wall group 11 and required to be driven.

When the heat dissipation device 100 according to the first embodiment of the present disclosure operates, the temperature sensor 33 senses a change in temperature at a position corresponding to each component of the terminal in real time, and feeds the sensed temperature change back to the processor 34 (such as, a central processing unit (CPU)) in the support plate 12. The processor 34 analyzes and calculates the temperature of each position, and obtains the heat source position with a high heat risk. This heat source position may be a position where the temperature is highest, or may be determined as desired. The processor 34 outputs the information of the heat source position to the driver 35 (such as, a motor) in the support plate 12. The driver 35 outputs a predetermined force to the blocking member groups 16, which push the corresponding blocking members 25 to be extended from the guiding holes 32, to form the corresponding ventilation wall group 11. In this way, the flow path S of the heat dissipation airflow is formed, thereby achieving the local heat dissipation of the terminal. When the temperature sensor 33 detects that the temperature in other regions of the terminal is increased, the processor 34 controls the driver 35 to remove the existing ventilation wall group 11 and generate a new ventilation wall group 11. In this way, the variable flow path S is configured to flexibly satisfy the heat dissipation requirement of the terminal, thereby achieving the best user experience.

Referring to FIG. 11, the processor 34 determines that the temperature at the position B in FIG. 11 is highest based on a temperature analysis of various positions of the terminal detected by the temperature sensor 33, and controls the driver 35 to transmit corresponding forces to the corresponding first partial blocking member groups 20 and the second partial blocking member groups 21 based on the preset ventilation wall information stored in the processor 34. Accordingly, the blocking members 25 of the first partial blocking member groups 20 are driven to pass through the guiding holes 32 to form the first ventilation wall 17, and the blocking members 25 of the second partial blocking member groups 21 are driven to pass through the guiding holes 32 to form the second ventilation wall 18. Further, the ventilation wall group 11 that is composed of the first ventilation wall 17 and the second ventilation wall 18 cooperates with the fan 13 to dissipate the heat at the heat source position. When the processor 34 determines that the heat source position where the temperature is highest is changed, as shown in FIG. 12, the heat source position is shifted to the position C. In this case, the driver 35 removes the corresponding force from the blocking member groups 16 for forming the original ventilation wall group 11, so that the original ventilation wall group 11 is removed. Then, the driver 35 transmits corresponding forces to the first partial blocking member groups 20 and the second partial blocking member groups 21 corresponding to the new ventilation wall group 11 based on the preset ventilation wall information stored in the processor 34, to form the new ventilation wall group 11, thereby realizing the heat dissipation at the new heat source position C.

In the heat dissipation device 100 according to the first embodiment of the present disclosure, an end of each blocking member 25 includes a soft magnetic material configured to provide stable connection of the blocking members 25 of the adjacent blocking member groups 16. In this case, the driver 35 is further configured to provide different electrical signals to the blocking members 25, such that the blocking members 25 have different magnetization directions, thereby realizing the contact and separation of the blocking members 25. For example, when two blocking members 25 are required to be extended to contact with each other, the driver 35 transmits the electrical signals to the two blocking members 25, such that the magnetization directions of the two blocking members 25 are opposite to each other, thereby allowing the blocking members 25 to be in contact with each other. When the blocking members 25 are required to be separated from each other, the driver 35 transmits the electrical signals to the two blocking members 25 that are in contact with each other, such that the magnetization directions of the two blocking members 25 are the same, thereby separating the blocking members 25 from each other.

In the above embodiments, the ventilation wall groups 11 are formed for the local heat dissipation based on the heat source position. When all the detected positions are required for heat dissipation, all the blocking members 25 may be maintained in the retracted state, and the heat dissipation airflow generated by the fan 13 flows through the gap 14 between every two adjacent blocking member groups 16, thereby realizing the entire heat dissipation.

The heat dissipation device 100 according to the first embodiment of the present disclosure can achieve the local heat dissipation, obtain the same ventilation input amount and the highest output efficiency, so that the temperatures of the local regions are reduced. The ventilation wall group 11 is formed and removed by the intelligent control, so that the flow path S of the heat dissipating airflow is variable. Therefore, great heat generated on various potential heat source positions in the terminal can be dissipated, so that the heat generated by components of the terminal can be dissipated in time during operation thereof, thereby prolonging the service life of the components of the terminal.

Second Embodiment

A second embodiment of the present disclosure provides a heat dissipation device 100. The structure and principle of the heat dissipation device 100 according to the second embodiment are substantially the same as those of the heat dissipation device 100 according to the first embodiment, except for the structure of the blocking member groups 16. Compared with the structure of the heat dissipation device 100 in the first embodiment in which the plurality of blocking members 25 is mounted on one blocking post 24 and driven by one driver 35, each of the blocking members 25 of the blocking member groups 16 of the heat dissipation device 100 according to the second embodiment is driven individually.

Referring to FIG. 29, in the heat dissipation device 100 according to the second embodiment of the present disclosure, the blocking post 24 has a plurality of blocking sub-posts 37 circumferentially arranged around the central axis 26 of the blocking post 24. Each of the blocking sub-posts 37 is installed with one blocking member 25. The driver 35 shown in FIG. 28 has a plurality of sub-drivers 38, each of which is installed on a respective blocking sub-post 37 of the plurality of blocking sub-posts 37 and correspondingly drives one blocking member 25 to move. In the heat dissipation device 100 according to the second embodiment of the present disclosure, the blocking member groups 16 are independently driven to form the ventilation wall groups 11 and can also achieve the technical effect of the first embodiment.

Third Embodiment

A third embodiment of the present disclosure provides a heat dissipation device 100. The structure and principle of the heat dissipation device 100 according to the third embodiment are substantially the same as those of the heat dissipation device 100 according to the first embodiment. Compared with the heat dissipation device 100 in the first embodiment, the heat dissipation device 100 according to the third embodiment can be applied to bendable applications, such as a flexible display device.

Referring to FIG. 30, the heat dissipation device 100 according to the third embodiment of the present disclosure further includes a second receiving member 39 and a controller electrically connected to the support plate 12. The support plate 12 includes a shape memory material that allows the support plate 12 to automatically roll into the same shape. When the heat dissipation device 100 operates in the first operation state, a flexible terminal is pulled along with the rotation of a rotatable shaft 41, and thus an operation area of the terminal becomes larger. For example, a display area of a display panel 200 becomes larger. Further, the controller controls engagement and rotation of a gear 40 in contact with the rotatable shaft 41 to control the support plate 12 to be unrolled and flattened, such that the heat dissipation device 100 is unrolled to form a box-type heat dissipation space, which is beneficial to the heat dissipation of the terminal. When the heat dissipation device 100 operates in a second operation state, the controller controls the support plate 12 to be rolled back to an original state before being flattened due to the shape memory material, so that the support plate 12 is received within the second receiving member 39.

Fourth Embodiment

Referring to FIG. 31, a fourth embodiment of the present disclosure provides a heat dissipation method for a terminal. The heat dissipation method dissipates heat from components of the terminal using the heat dissipation device according to the first embodiment of the present disclosure. The heat dissipation method includes:

sensing temperatures at different positions of the terminal to determine at least one heat source position; and forming at least one ventilation wall group based on the temperature at least one of the positions, the at least one ventilation wall group having a flow path for allowing heat dissipation airflow to flow therethrough, and the at least one heat source position being located in the flow path.

In the heat dissipation method according to the fourth embodiment of the present disclosure, the heat dissipation device is in the operation state once the terminal is activated. The temperatures at different positions of the terminal are monitored in real time, so that the different heat source positions generated in different periods can be detected, so as to form the ventilation wall groups to dissipate the heat generated at the heat source position. Further, the flow path of the heat dissipation airflow can be changed by removing the old ventilation wall group and forming the new ventilation wall group, to achieve the entire heat dissipation of the terminal throughout the entire period and improve the use experience of the user.

Fifth Embodiment

Figure 32:
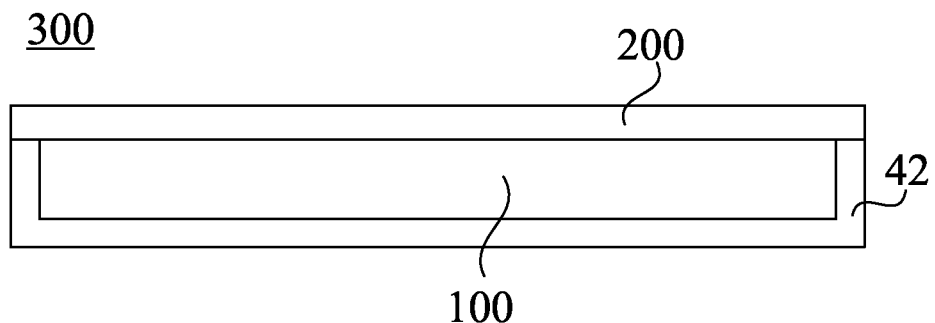
FIG. 32 is an overall schematic view of a terminal according to a fifth embodiment of the present disclosure.
Figure 33:
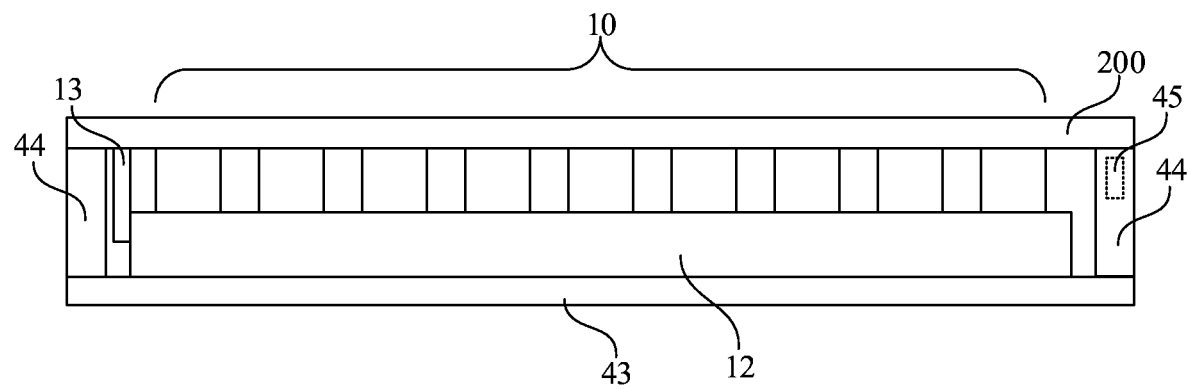
FIG. 33 is a schematic structural view of the terminal according to the fifth embodiment of the present disclosure.
Figure 34:
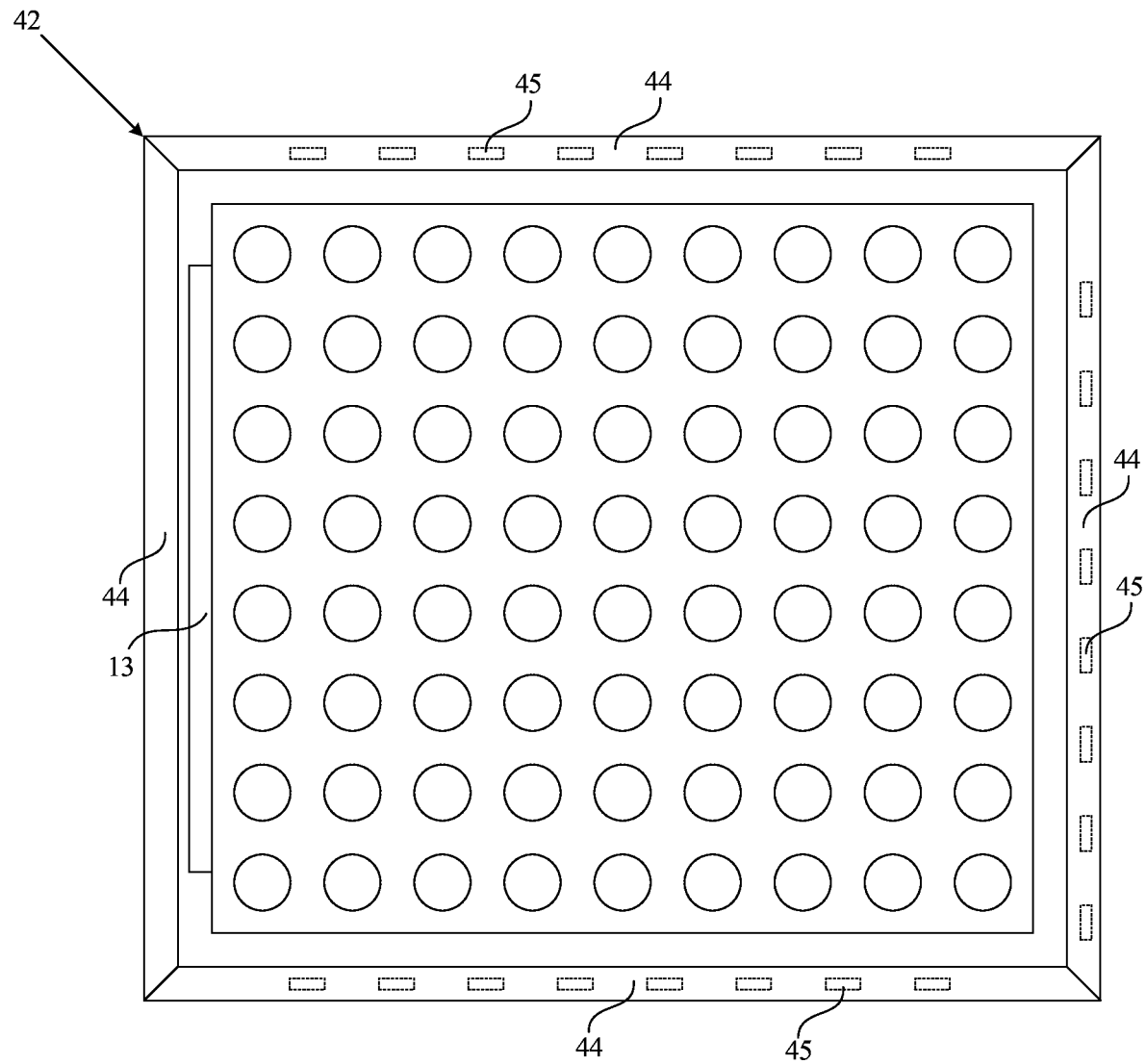
FIG. 34 is a schematic plan view of the terminal according to the fifth embodiment of the present disclosure, in which air outlets are disposed in an upper frame, a lower frame and a right frame.
Figure 35:
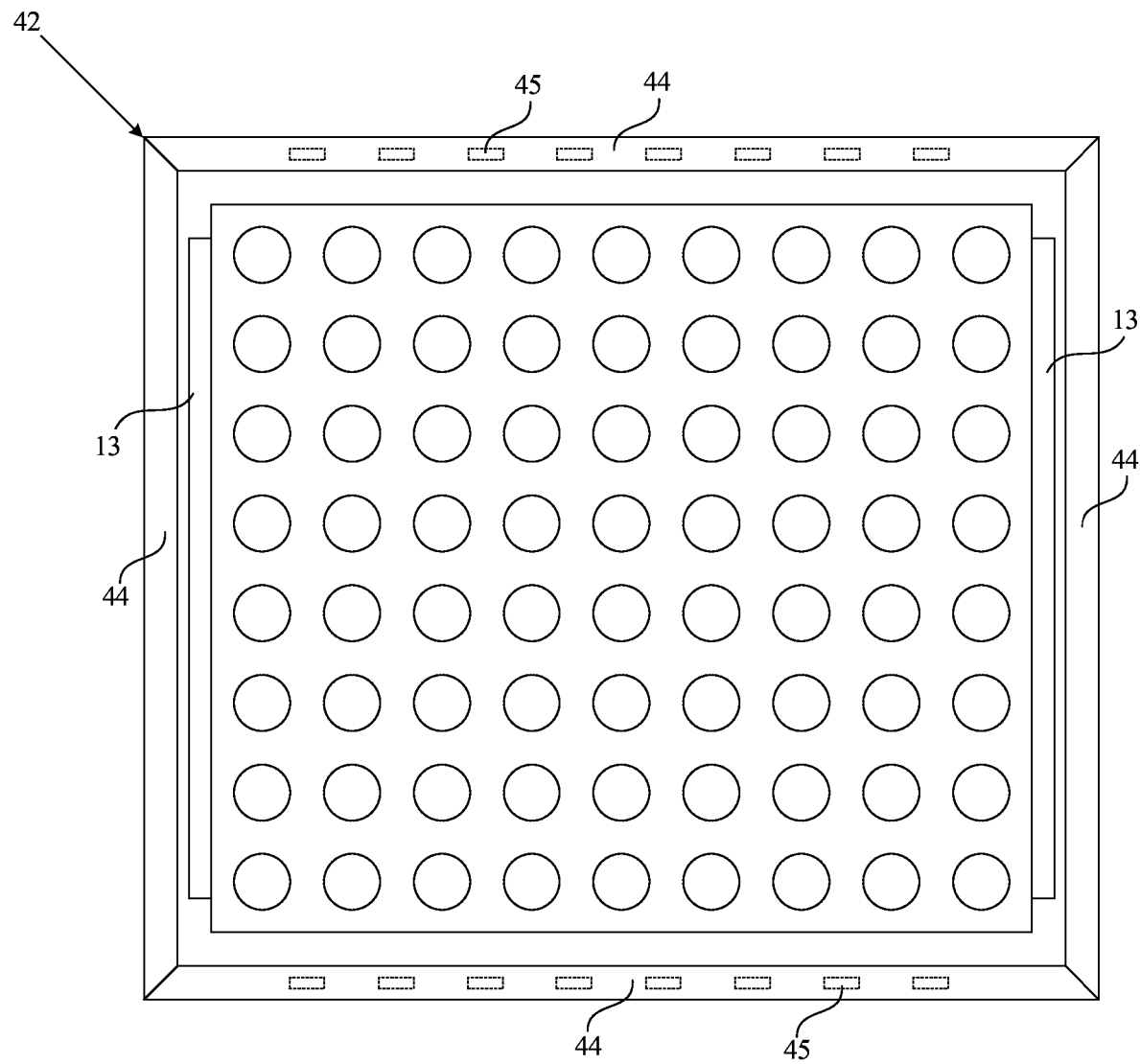
FIG. 35 is a schematic plan view of the terminal according to the fifth embodiment of the present disclosure, in which the air outlets are disposed in the upper frame and the lower frame.
Figure 36:
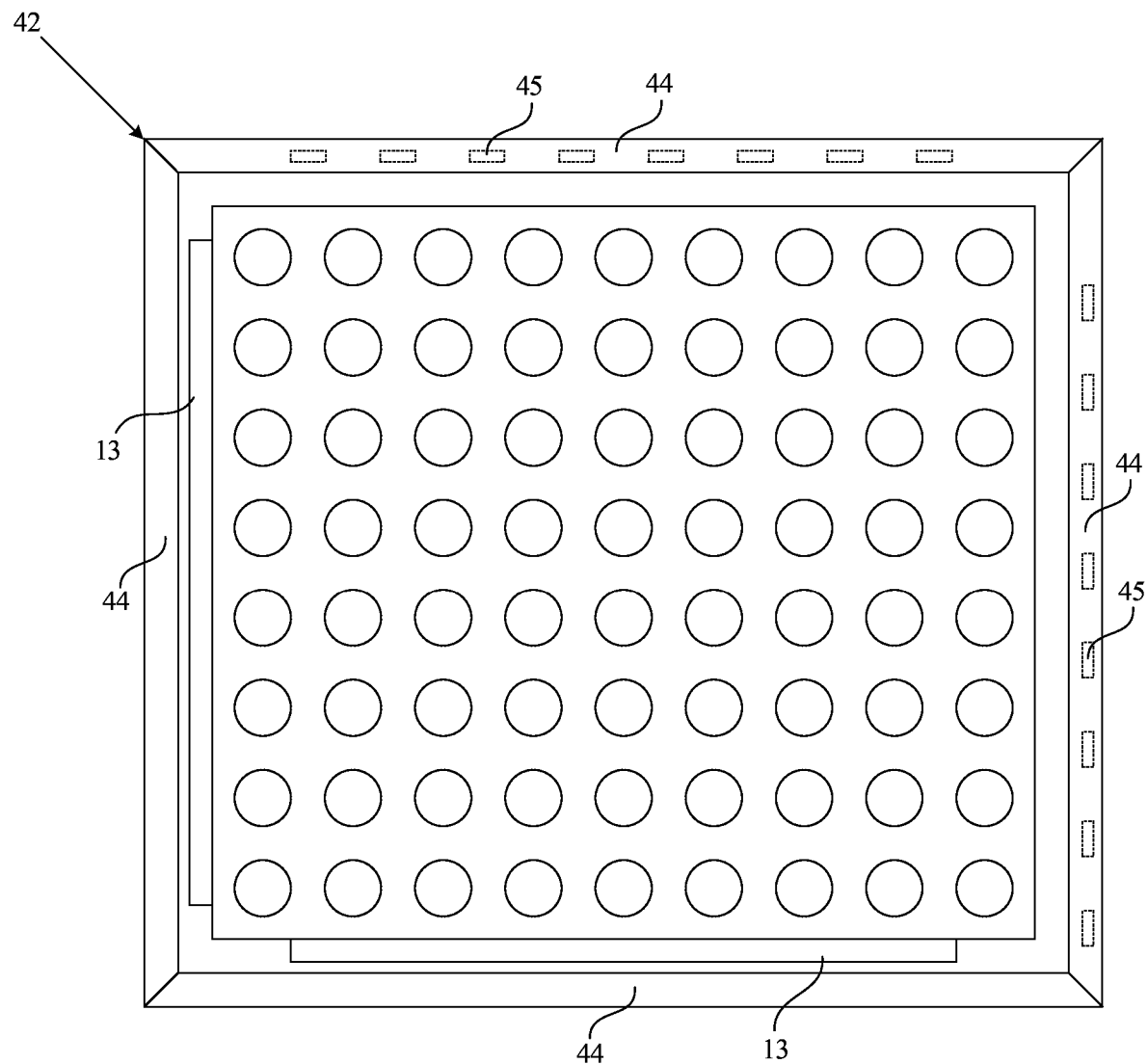
FIG. 36 is a schematic plan view of the terminal according to the fifth embodiment of the present disclosure, in which the air outlets are disposed in the right frame and the upper frame.
Figure 37:
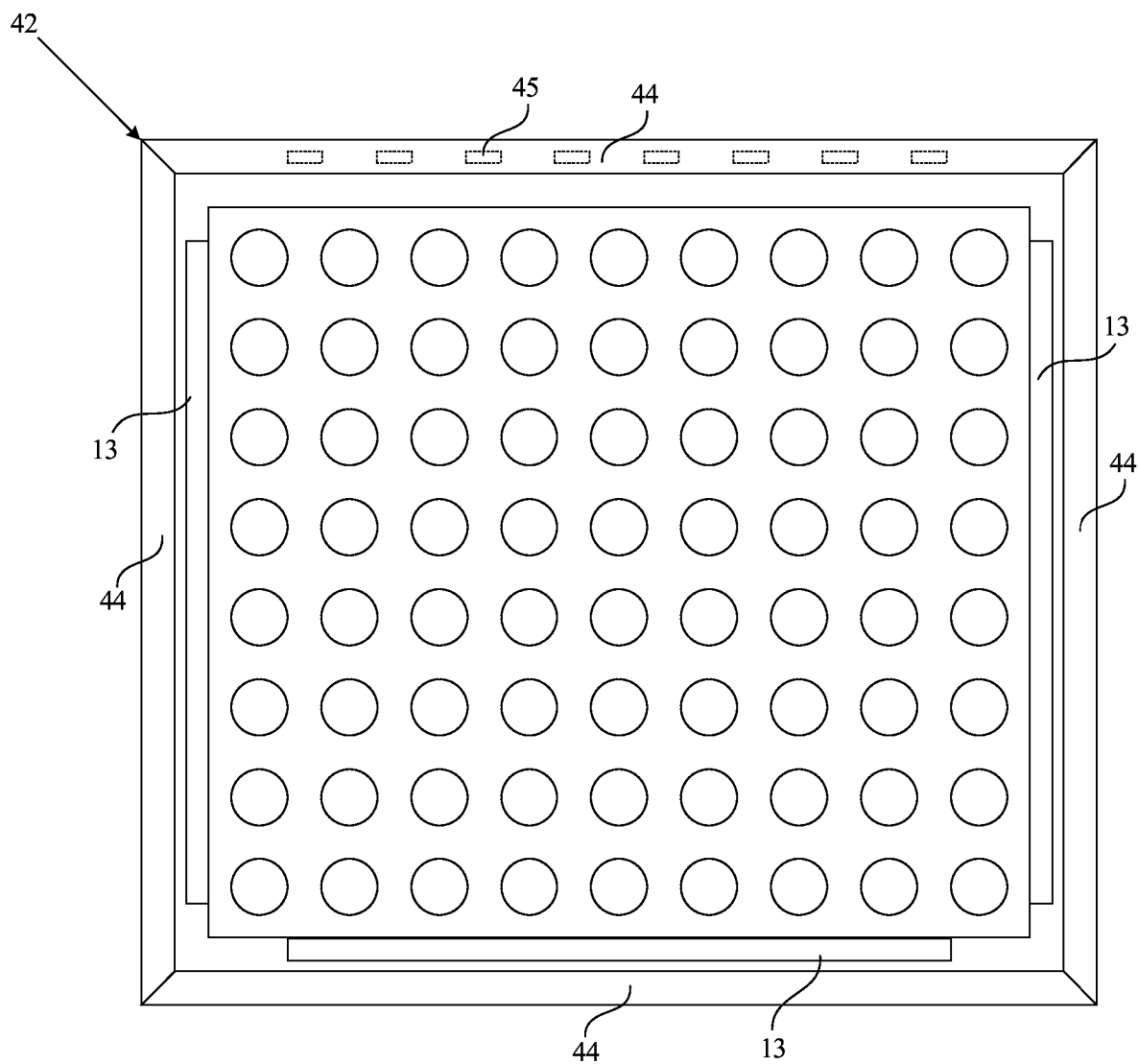
FIG. 37 is a schematic plan view of the terminal according to the fifth embodiment of the present disclosure, in which the air outlets are disposed in the upper frame.
Figure 38:
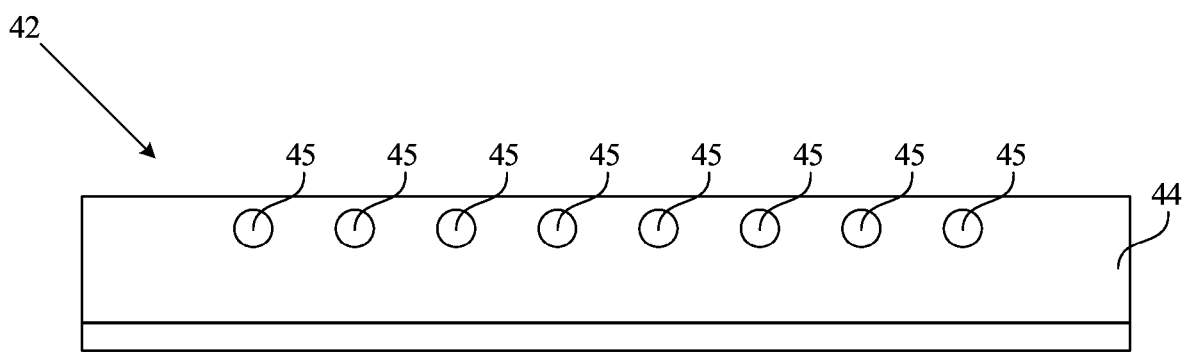
FIG. 38 is a schematic plan view of the terminal according to the fifth embodiment of the present disclosure, in which a plurality of air outlets are disposed in a single frame.
Figure 39:
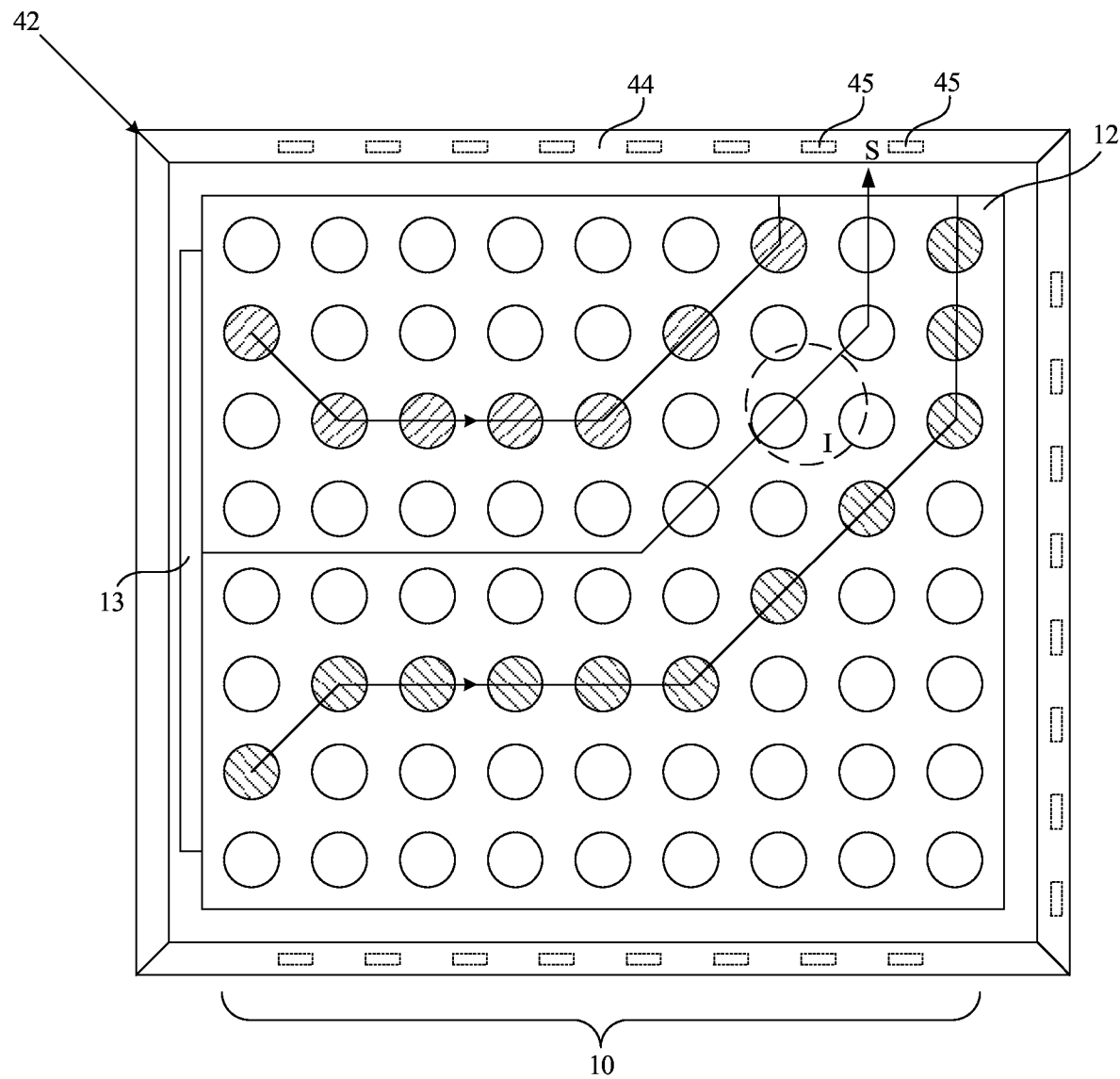
FIG. 39 is a schematic plan view of the terminal according to the fifth embodiment of the present disclosure, in which the fan, the flow path and the air outlets are in communication with each other.

Referring to FIG. 32, a fifth embodiment of the present disclosure provides a terminal 300. The terminal 300 includes a casing 42, a display panel 200, and the heat dissipation device 100 according to the first embodiment, the second embodiment or the third embodiment of the present disclosure. The display panel 200 is mounted on the heat dissipation device 100. When the heat dissipation device 100 operates, the heat generated in the display panel 200 is dissipated by the heat dissipation method according to the fourth embodiment of the present disclosure. The display panel 200 may be a rollable screen described in the third embodiment, or a non-deformable flat panel display device. Referring to FIG. 33, the casing 42 has a bottom plate 43 and a plurality of frames 44 located on edges of the bottom plate 43. The bottom plate 43 and the plurality of frames 44 form a heat dissipation space between the display panel 200 and the heat dissipation device 100, such that the heat dissipation airflow can flow in this space during the operation of the heat dissipation device 100. Further, the gaps 14 between the adjacent blocking members 15 in the heat dissipation device 100 may be used as a space for allowing the heat dissipation airflow to flow therethrough (see FIG. 1). In addition, the casing 42 is provided with an air outlet 45. The variable ventilation wall assembly 10, the support plate 12 and the fan 13 are disposed within the casing 42. The support plate 12 is disposed on the bottom plate 43. The plurality of frames 44 are arranged around the support plate 12. Each edge of the support plate 12 corresponds to one frame 44. The air outlet 45 is disposed in at least one frame 44, and the fan 13 is disposed at an edge of the support plate 12 corresponding to the frame 44 without the air outlet 45. The fan 13 and the air outlet 45 correspond to different frames 44, respectively. The support plate 12 and the bottom plate 43 may abut against each other to form the heat dissipation space between the support plate 12, the frames 44 and the display panel 200. In at least one embodiment, the support plate 12 and the bottom plate 43 may not abut against each other, and other electronic components, such as batteries, circuit boards, etc., may be mounted between the support plate 12 and the bottom plate 43. In this case, the heat dissipation space is also formed between the support plate 12, the frames 44 and the display panel 200. Further, the heat dissipation device 100 may be provided with one or more fans 13 that may correspond to one frame 44 or the plurality of frames 44. The casing 42 may be provided with one or more air outlets 45. The air outlet(s) 45 may be disposed in one frame 44 or the plurality of frames 44. In at least one embodiment, the casing 42 has a cuboid shape, the bottom plate 43 has a rectangular shape, and the casing 42 is provided with four frames 44. Referring to FIG. 34, the fan 13 corresponds to the left frame 44 of the casing 42, and the air outlets 45 are disposed in a right frame 44, an upper frame 44 and a lower frame 44 of the casing 42. Referring to FIG. 35, the fans 13 respectively correspond to the left and right frames 44 of the casing 42, and the air outlets 45 are disposed in the upper and lower frames 44 of the casing 42. Referring to FIG. 36, the fans 13 correspond to the left and lower frames 44 of the casing 42, and the air outlets 45 are disposed in the upper and right frames 44 of the casing 42. Referring to FIG. 37, the fans 13 correspond to the left, right and lower frames 44 of the casing 42, and the air outlets 45 are disposed in the upper frame 44 of the casing 42. Referring to FIG. 38, when viewed from the frame 44 provided with the air outlets 45, the air outlets 45 of the plurality of air outlets 45 are sequentially arranged on a portion of the frame 44 close to an upper end thereof to communicate with the heat dissipation space in the casing 42. In some other embodiments of the present disclosure, a single frame 44 may be provided with one air outlet 45. Referring to FIG. 39, the air outlets 45 are in thermal communication with the flow path S, and the fan 13, the flow path S and the air outlets 45 are sequentially communicated with each other to guide the heat dissipation airflow generated by the fan 13 to flow to the heat source position and finally flow out from the air outlets 45. When the heat source position is located at a position I, the heat dissipation airflow flows out from the air outlets 45 in the upper frame 44 of the support plate 12. The variable ventilation wall assembly 10 and the support plate 12 are enclosed in the heat dissipation space of the casing 42, and the heat dissipation airflow is generated by the fan 13 and blown to the heat source position along the flow path S, and finally flows out from the air outlets 45, which is beneficial for the guiding and the heat dissipation of the heat dissipation airflow and protection to internal components.

The heat source position may be determined based on brightness and continuous operation period of a displayed picture. The processor detects luminous brightness of various positions on the display panel and compares the detected brightness with a preset brightness condition to determine the heat source position.

The heat dissipation device, the heat dissipating method and the terminal described in some embodiments of the present disclosure can correspondingly form the ventilation walls for dissipating the heat at different the heat source positions and the flow path of the heat dissipation airflow generated by the ventilation walls based on different heat source positions generated in the terminal in different applications. Further, the entire heat dissipation of the terminal can be achieved by the flexible and variable flow path, so that the good user experience is obtained.

The above embodiments are only the preferred embodiments of the present disclosure and are not intended to limit the present disclosure thereto. Any modification, equivalent replacement, improvement, etc. made within the spirit and principle of the present disclosure shall fall within the scope of the present disclosure.

What is claimed is:

1. A heat dissipation device for a terminal, the heat dissipation device comprising:
    a variable ventilation wall assembly configured to form a plurality of ventilation wall groups based on at least one heat source position of the terminal,
    wherein each ventilation wall group of the plurality of ventilation wall groups defines a flow path, along which a heat dissipation airflow flows;
    wherein each of the at least one heat source position is located in one of the flow paths of the plurality of ventilation wall groups; and
    wherein the variable ventilation wall assembly comprises a plurality of blocking member groups located at different positions of a plane of the terminal, and a gap is formed between two adjacent blocking member groups of the plurality of blocking member groups;
    each ventilation wall group of the plurality of ventilation wall groups comprises a first ventilation wall and a second ventilation wall that are configured to define the flow path, and at least one of the first ventilation walls or the second ventilation walls of different ventilation wall groups of the plurality of ventilation wall groups are different in at least one of position or shape;
    operation states of the heat dissipation device comprise a first operation state in which the plurality of blocking member groups comprises a plurality of first partial blocking member groups, a plurality of second partial blocking member groups, and a plurality of third partial blocking member groups,
    the plurality of first partial blocking member groups is continuously arranged in a first direction, and two adjacent first partial blocking member groups of the plurality of first partial blocking member groups are in contact with each other to block the gap therebetween to form the first ventilation wall extending in the first direction;
    the plurality of second partial blocking member groups is continuously arranged in a second direction, and two adjacent second partial blocking member groups of the plurality of second partial blocking member groups are in contact with each other to block the gap therebetween to form the second ventilation wall extending in the second direction;
    the plurality of third partial blocking member groups is arranged in the flow path or outside at least one of the first ventilation wall or the second ventilation wall, two adjacent third partial blocking member groups of the plurality of third partial blocking member groups are spaced at the gap therebetween, one of the plurality of third partial blocking member groups and one of the plurality of first partial blocking member groups that are adjacent to each other are spaced at the gap therebetween, and one of the plurality of third partial blocking members and one of the plurality of second partial blocking member groups that are adjacent to each other are spaced at the gap therebetween; and
    a space is formed between the first ventilation wall and the second ventilation wall.

2. The heat dissipating device according to claim 1, wherein each blocking member group of the plurality of blocking member groups comprises a blocking post and a plurality of blocking members installed on the blocking post, and the plurality of blocking members extends in different directions that are parallel to the plane of the terminal; and
    in the first operation state, among the plurality of first partial blocking member groups, one of a plurality of blocking members extending in the first direction, of one first partial blocking member group, is in contact with one of a plurality of blocking members extending in the first direction, of another first partial blocking member group adjacent to the one first partial blocking member group; and among the plurality of second partial blocking member groups, one of a plurality of blocking members extending in the second direction, of one second partial blocking member group, is in contact with one of a plurality of blocking members extending in the second direction, of another second partial blocking member group adjacent to the one second partial blocking member group.

3. The heat dissipation device according to claim 2, wherein the variable ventilation wall assembly further comprises a temperature sensor, a processor, and a driver;
    the temperature sensor is configured to sense temperatures at different positions of the terminal and transmit the sensed temperatures to the processor;
    the processor is configured to obtain, based on a preset temperature condition, the at least one heat source position of the terminal that meets the preset temperature condition, to obtain ventilation wall information corresponding to the at least one heat source position and a temperature at the at least one heat source position based on a preset ventilation wall condition, and to transmit the ventilation wall information to the driver;
    the driver is configured to drive, based on the ventilation wall information, the plurality of blocking members of the plurality of blocking member groups to move; and
    the ventilation wall information comprises position information and shape information of the plurality of ventilation wall groups.

4. The heat dissipation device according to claim 3, wherein in each blocking member group of the plurality of blocking member groups, the blocking post comprises a plurality of blocking sub-posts circumferentially arranged around a central axis of the blocking post, and each blocking sub-post of the plurality of blocking sub-posts is correspondingly installed with one of the plurality of blocking members; and the driver comprises a plurality of sub-drivers, and each of the plurality of sub-drivers is correspondingly installed on one of the plurality of blocking sub-posts and correspondingly drives one of the plurality of blocking members to move.

5. The heat dissipation device according to claim 3, wherein each blocking member of the plurality of blocking members comprises a plurality of blocking sub-members sequentially nested in an extending direction of the blocking member, and two adjacent sub-blocking members of the plurality of sub-blocking members are movable relative to each other under driving of the driver.

6. The heat dissipating device according to claim 3, wherein each blocking member group of the plurality of blocking member groups further comprises a plurality of elastic members connected to the plurality of blocking members, and each elastic member of the plurality of elastic members is deformable along an extending direction of one of the plurality of blocking members under driving of the driver.

7. The heat dissipating device according to claim 3, wherein the variable ventilation wall assembly further comprises a plurality of first receiving members, and each first receiving member of the plurality of first receiving members comprises a cavity and a housing that at least partially encloses the cavity, the housing comprises a plurality of guiding holes in communication with the cavity, and the blocking member group is located in the cavity;

the terminal is supported by the housing, and the temperature sensor is located at a side of the housing close to the terminal; and an end of each of the plurality of blocking members is movable to outside of the housing or inside of the cavity through one of the plurality of guiding holes.

8. The heat dissipation device according to claim 7, wherein blocking members of the plurality of blocking members are equally spaced in a circumferential direction of one of the plurality of first receiving members.

9. The heat dissipation device according to claim 3, wherein an end of each of the plurality of blocking members comprises a soft magnetic material, and the driver is further configured to provide different electrical signals to the plurality of blocking members in such a manner that the plurality of blocking members has different magnetization directions.

10. The heat dissipation device according to claim 3, wherein the variable ventilation wall assembly further comprises a pressure sensor configured to sense pressures applied on ends of the plurality of blocking members and transmit the sensed pressures to the driver; and the driver is further configured to control the plurality of blocking members to stop based on a preset pressure condition.

11. The heat dissipation device according to claim 1, wherein
blocking member groups of the plurality of blocking member groups are arranged in an array.

12. The heat dissipating device according to claim 1, further comprising:

a support plate configured to support the plurality of blocking member groups, the support plate being located at a side of the plurality of blocking member groups facing away from the terminal.

13. The heat dissipation device according to claim 12, further comprising:

a second receiving member; and
a controller electrically connected to the support plate,
wherein the support plate comprises a shape memory material, and the operation states of the heat dissipation device further comprise a second operation state;
wherein the controller is configured to control the support plate to be unrolled and flattened in the first operation state; and
wherein the controller is configured to control the support plate to be rolled to be received in the second receiving member in the second operation state.

14. A heat dissipation method of a terminal, the heat dissipation method using a heat dissipation device, wherein the heat dissipation device comprises a variable ventilation wall assembly configured to form a plurality of ventilation wall groups based on at least one heat source position of the terminal, each ventilation wall group of the plurality of ventilation wall groups defines a flow path, along which a heat dissipation airflow flows, and wherein each of the at least one heat source position is located in one of the flow paths of the plurality of ventilation wall groups; and wherein the heat dissipation method comprises:
sensing temperatures at different positions of the terminal to determine the at least one heat source position; and
forming at least one ventilation wall group of the plurality of ventilation wall groups based on the sensed temperature at the at least one heat source position.

15. The heat dissipation method according to claim 14, wherein the variable ventilation wall assembly comprises a plurality of blocking member groups corresponding to the different positions of the terminal, and two adjacent blocking member groups of the plurality of blocking member groups are positioned to define a gap therebetween;

each ventilation wall group of the plurality of ventilation wall groups comprises a first ventilation wall and a second ventilation wall that define the flow path of the heat dissipation airflow, and at least one of the first ventilation walls or the second ventilation walls of different ventilation wall groups of the plurality of ventilation wall groups are different in at least one of position or shape;

the plurality of blocking member groups comprises a plurality of first partial blocking member groups, a plurality of second partial blocking member groups, and a plurality of third partial blocking member groups;

the plurality of first partial blocking member groups is continuously arranged in a first direction, the plurality of second partial blocking member groups is continuously arranged in a second direction, and the plurality of third partial blocking member groups is arranged in the flow path or outside at least one of the first ventilation wall or the second ventilation wall; and the heat dissipation method further comprises, between sensing the temperatures at the different positions of the terminal and forming the at least one ventilation wall group based on the sensed temperature on the at least one heat source position:

obtaining the at least one heat source position of the terminal that meets a preset temperature condition;
obtaining ventilation wall information corresponding to the at least one heat source position and a temperature on the at least one heat source position based on a preset ventilation wall condition; and based on the wind wall information, controlling two adjacent first partial barrier groups of the plurality of first partial blocking member groups to be in contact with each other to block the gap therebetween to form the first ventilation wall, and controlling two adjacent second partial barrier groups of the plurality of second partial blocking member groups to be in contact with each other to block the gap therebetween to form the second ventilation wall, wherein a space is formed between the first ventilation wall and the second ventilation wall, wherein the ventilation wall information comprises position information and shape information of the at least one ventilation wall group to be formed.

16. A terminal, comprising:

a casing;

a display panel; and a heat dissipation device comprising a variable ventilation wall assembly configured to form a plurality of ventilation wall groups based on at least one heat source position of the terminal, wherein each ventilation wall group of the plurality of ventilation wall groups defines a flow path, along which a heat dissipation airflow flows;

wherein each of the at least one heat source position is located in one of the flow paths of the plurality of ventilation wall groups; and wherein the heat dissipation device is installed in the casing, and the display panel is installed on the heat dissipation device.

17. The terminal according to claim 16, wherein the casing comprises a bottom plate and a plurality of frames arranged on edges of the bottom plate, the heat dissipation device is disposed on the bottom plate, and the plurality of frames is arranged around the heat dissipation device; and the casing is provided with at least one air outlet, the variable ventilation wall assembly is disposed in the casing, the at least one air outlet is disposed in at least one of the plurality of frames, and the at least one air outlet is in thermal communication with the flow path.

\* \* \* \* \*